US005963651A

United States Patent [19]

[11] Patent Number: 5,963,651

Van Veen et al.

[45] Date of Patent: Oct. 5, 1999

[54] ADAPTIVE ACOUSTIC ATTENUATION SYSTEM HAVING DISTRIBUTED PROCESSING AND SHARED STATE NODAL ARCHITECTURE

[75] Inventors: Barry D. Van Veen, McFarland, Wis.; Olivier E. Leblond, Ressons sur Matz, France; Daniel J. Sebald, Sheboygan Falls, Wis.

[73] Assignees: Digisonix, Inc., Middleton; Nelson Industries, Inc., Stoughton, both of Wis.

[21] Appl. No.: 08/783,426

[22] Filed: Jan. 16, 1997

[51] Int. Cl.[6] .................................................. H03B 29/00

[52] U.S. Cl. .................................... 381/71.11; 381/71.12

[58] Field of Search ............................ 381/71.11, 71.12, 381/71.1, 71.8, 73.1, 93, 94.1; 708/322

[56] References Cited

U.S. PATENT DOCUMENTS

| | | |
|---|---|---|
| 5,426,720 | 6/1995 | Bozich et al. . |
| 5,434,783 | 7/1995 | Pal et al. . |
| 5,557,682 | 9/1996 | Warner et al. . |
| 5,570,425 | 10/1996 | Goodman et al. . |

OTHER PUBLICATIONS

The Electrical Engineering Handbook, Chapter 19—Neural Networks, CRC Press, 1993, pp. 420–429.

*Primary Examiner*—Vivian Chang
*Attorney, Agent, or Firm*—Andrus, Sceales, Starke & Sawall

[57] ABSTRACT

An adaptive acoustic attenuation system has distributed nodal processing and a shared state nodal architecture. The system includes a plurality of adaptive filter nodes, each preferably having a dedicated digital signal processor. Each adaptive filter node preferably receives a reference signal and generates a correction signal that drives an acoustic actuator. Each adaptive filter node also shares nodal state vectors with adjacent adaptive filter nodes. The calculation of the nodal correction signals depends both on the reference signal and nodal state vectors received from adjacent adaptive filter nodes. The calculation of nodal state vectors shared with adjacent adaptive filter nodes depends on nodal state vectors received from other adjacent adaptive filter nodes as well as nodal reference signals inputting the adaptive filter node. Adaptation of adaptive weight vectors for generating the correction signals and adaptive weight matrices for generating nodal state signal vectors are adapted in accordance with globally transmitted error signals being back-propagated through the appropriate acoustic and electrical paths. The adaptive filter nodes can be arranged in a linear network topology, or in some other network topology such as but not limited to a random web network topology. The system allows the addition or elimination of additional reference signals and/or acoustic actuators with associated digital signal processing nodes to the system without requiring the system to be reconfigured and without requiring rewriting of software. The system is well-suited for high dimensional MIMO active acoustic attenuation systems.

46 Claims, 10 Drawing Sheets

ADAPTIVE ACOUSTIC ATTENUATION SYSTEM HAVING DISTRIBUTED PROCESSING AND SHARED STATE NODAL ARCHITECTURE

FIELD OF THE INVENTION

This invention relates to adaptive acoustic attenuation systems, and is especially useful in systems having large numbers of inputs and outputs. The invention involves the distribution of processing among adaptive filter nodes using a shared state nodal architecture.

BACKGROUND OF THE INVENTION

In an adaptive, multi-channel acoustic attenuation system, acoustic disturbances in an acoustic plant are sensed with error sensors, such as microphones or accelerometers, that supply an error signal to a multi-channel adaptive filter control model. The multi-channel adaptive filter control model is normally located in a centralized, electronic controller (i.e., a MIMO digital signal processor) having a central processing unit, memory, digital to analog converters, analog to digital converters, and input and output ports. In an adaptive active system, the adaptive filter control model supplies a correction signal to an active actuator or output transducer such as a loudspeaker or electromechanical shaker. The active actuator injects a cancelling acoustic wave into the acoustic plant to destructively interfere with the acoustic disturbance so that the output acoustic wave at the error sensors is close to zero or some other desired value. In an adaptive passive system, the adaptive filter control model supplies a correction signal to an actuator that adjusts a physical property of a passive component in the acoustic plant so that the acoustic disturbance at the error sensors is close to zero or some other desired value.

Adaptive acoustic attenuation systems often include multiple sensors and can include multiple active actuators and/or multiple adjustable passive components. Adaptive acoustic attenuation systems can use either feedforward or feedback adaptive control models. In feedforward systems, additional input sensors are needed to sense input acoustic waves and provide input reference signals to the channels of the adaptive filter model. A multi-channel adaptive filter control model typically adapts to model the acoustic plant to minimize the global cost function of the error signals from the error sensors. It is normally preferred that the channels in the adaptive filter control model either be intraconnected, or decoupled, as shown in U.S. Pat. No. 5,216,721 to Douglas E. Melton; U.S. Pat. No. 5,216,722 to Steven R. Popovich; and U.S. Pat. No. 5,420,932 to Seth D. Goodman. Allowed U.S. patent application Ser. No. 08/297,241, entitled "Adaptive Control System With A Corrected Phase Filtered Error Update" by Steven R. Popovich, filed on Aug. 25, 1994 discloses in FIG. 5 a MIMO adaptive control system in which the signals from the error sensors are filtered preferably to account for delays in phase changes due to the speaker error paths. These patents and the allowed patent application are assigned to the assignee of the present invention and are incorporated herein by reference.

Normally a distinct cable is required to connect each sensor, active actuator and/or passive component actuator to the centralized digital signal processor. In systems having a small number of sensors and/or actuators, or in systems where components are closely located to the digital signal processor, this type of star architecture and the number of distinct cables does not normally present a problem. However, in systems with numerous sensors and/or actuators, the number, weight and cost of cables can become a significant concern. U.S. Pat. No. 5,570,425, entitled "Daisy Chain" by Goodman, Eriksson et al., provides a central MIMO controller communicating through a control network that interfaces with sensor and actuator nodes to dispense with the need for providing separate cables from the centralized digital signal processor to each separate sensor and/or actuator. The network system shown in U.S. Pat. No. 5,570,425 discloses sensor and actuator nodes that may or may not include processing capabilities, but the overall system is governed by a centralized MIMO digital signal processor.

Data processing and data transmission requirements using a centralized digital signal processor can become extremely burdensome, especially as the number of sensors and actuators becomes large. In these large dimensional systems, input/output capabilities and computational processing requirements can exceed capabilities of a centralized digital signal processor. It is therefore desirable in some applications to decentralize adaptive filter processing, and eliminate the need for a centralized digital signal processor in a MIMO adaptive acoustic attenuation system.

U.S. Pat. No. 5,557,682 entitled "Multi-Filter-Set Active Adaptive Control System" by J. V. Warner et al., discloses several ways of interfacing two or more digital signal processors when it is necessary to increase either the input/output capabilities or processing capabilities of the system. U.S. Pat. Nos. 5,557,682 and 5,570,425 are assigned to the assignee of the present invention and are incorporated herein by reference. In general, the system must be reconfigured and software rewritten whenever sensors and/or actuators are added or deleted from the system. In high dimensional systems, this type of reconfiguration and software rewriting is not desirable.

BRIEF SUMMARY OF THE INVENTION

The invention is a multiple input multiple output adaptive control system that attenuates acoustic disturbances within an acoustic plant, and provides distributed processing for the multiple input multiple output adaptive filter control model via a shared state nodal architecture. The system includes a plurality of adaptive filter nodes each including a nodal digital signal processor. Each adaptive filter node is preferably associated with at least one acoustic actuator. Each adaptive filter node associated with an acoustic actuator generates a correction signal to drive the acoustic actuator. In general, each adaptive filter node also receives a reference signal $x_i[k]$. The adaptive filter nodes generate nodal state signal vectors that are shared with the adjacent adaptive filter nodes. Based on the reference signal input to the respective adaptive filter node and the nodal state signal vectors from adjacent adaptive filter nodes, the correction signals are calculated in accordance with adaptive weight vectors. The adaptive weight vectors are updated in accordance with one or more error signals that are transmitted globally to all of the nodes within the system. Preferably, the nodal output adaptive weight vectors are updated in accordance with error signals filtered through the appropriate acoustic paths.

The nodal state signal vectors, which are shared with the adjacent adaptive filter nodes, are generated in accordance with nodal state adaptive weight matrices which are also adapted in accordance with the globally transmitted error signals. Preferably, the nodal state adaptive weight matrices are adapted in accordance with back propagation of error signals through the appropriate acoustic and electronic paths. It is convenient to do this by transmitting back-propagated filtered error signal vectors between nodes.

The invention thus provides a modular adaptive acoustic attenuation system that is especially well-suited for high dimensional MIMO systems. Additional input sensors and/or acoustic actuators with associated digital signal processing nodes can be added or subtracted from the system without requiring the system to be reconfigured and without requiring the rewriting of software. However, if it is desired to provide additional error sensors, or reduce the number of error sensors, it may be necessary to reconfigure the digital signal processing nodes to accommodate a change in the number of error signals as long as the error signals are transmitted globally.

If a digital signal processing node goes down, or there is a fault in the communications between digital signal processing nodes, the system will effectively separate into two separate adaptive acoustic attenuation systems, both attempting to obtain global minimization of acoustic disturbances within the acoustic plant.

The adaptive filter nodes can be arranged in a linear network topology, a rectangular network topology, or in some other network topology such as but not limited to a random web topology. Depending on the network topology used, the invention can provide a way to significantly reduce the amount of cable in a high dimensional adaptive acoustic attenuation system.

BRIEF DESCRIPTION OF THE DRAWINGS

Prior Art

Present Invention

Figure 2:
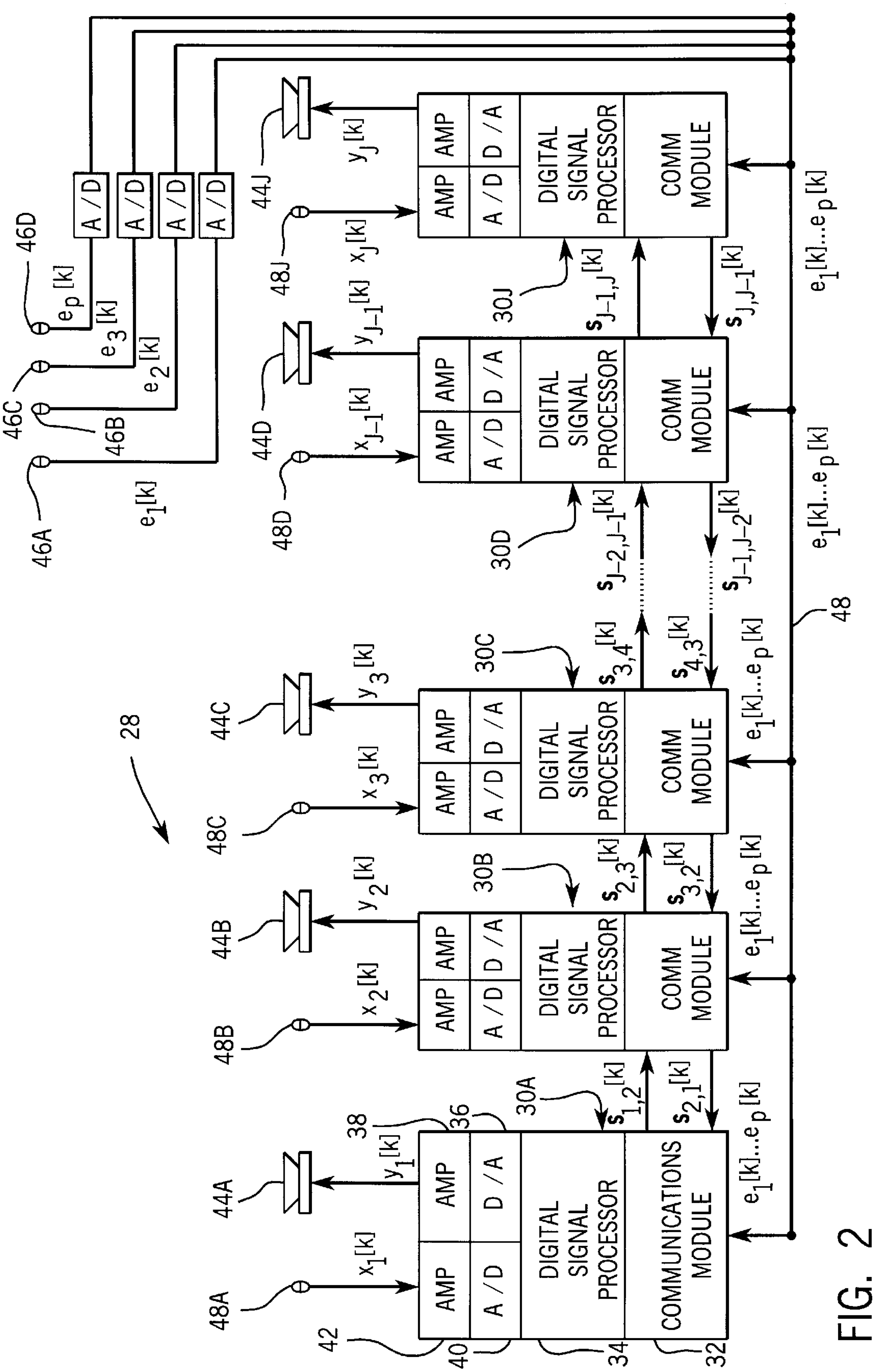

FIG. 2 illustrates an adaptive acoustic attenuation system having distributed processing and shared state nodal architecture in accordance with the invention.

Figure 3:
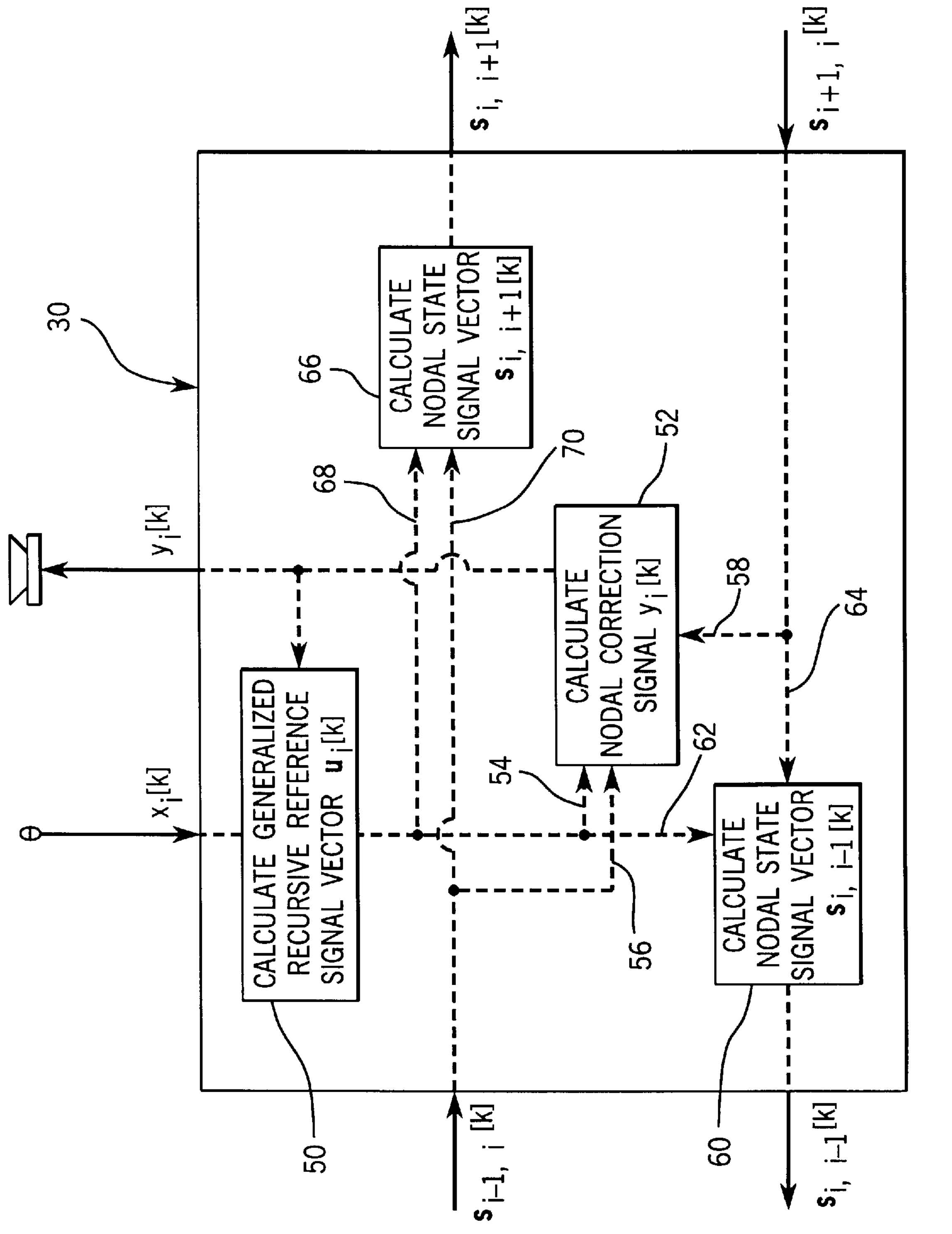

FIG. 3 illustrates the calculation of nodal correction signals and nodal state signal vectors in an adaptive filter node of the system of FIG. 2.

Figure 4:
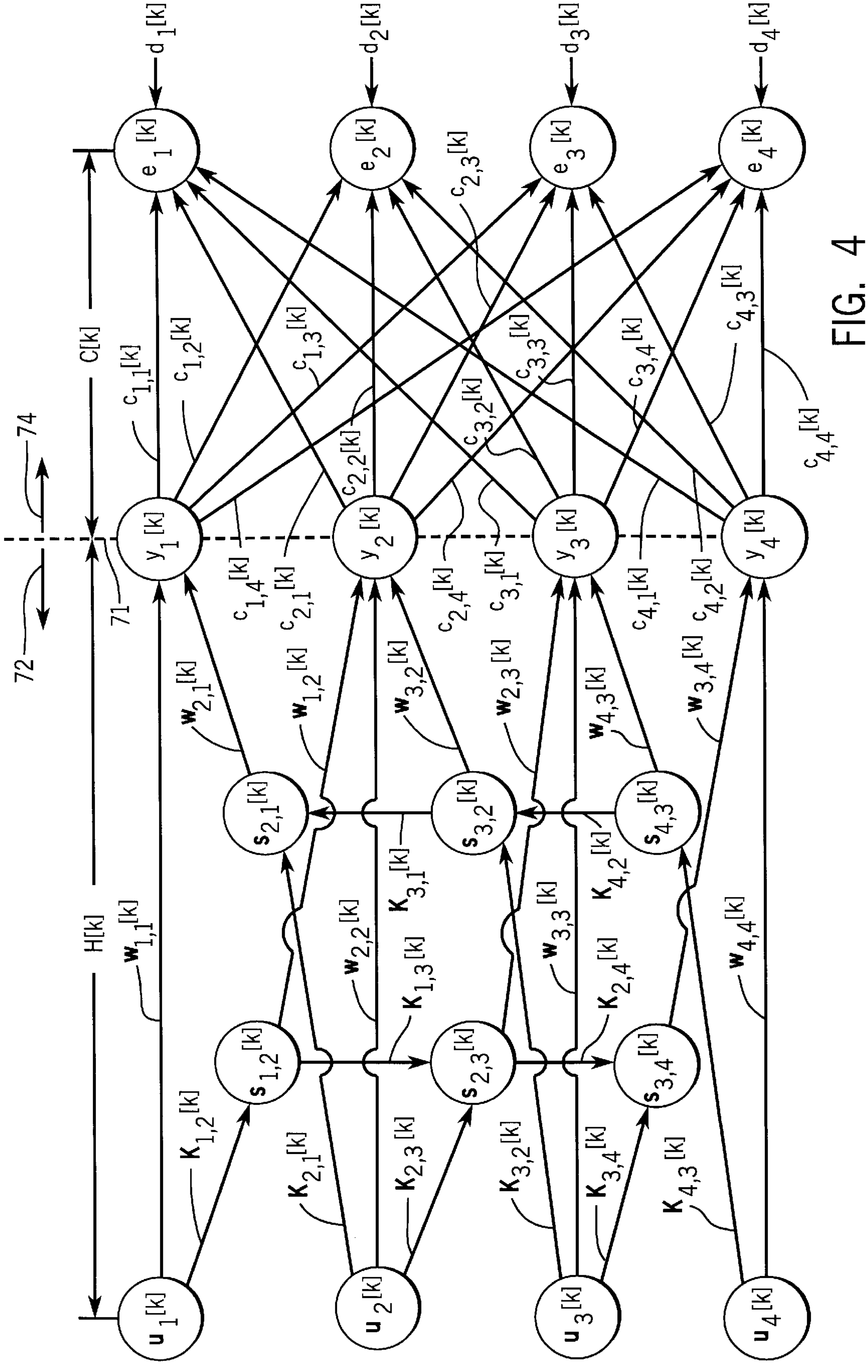

FIG. 4 illustrates the electrical and acoustic paths through a 4×4×4 multiple input multiple output system as shown in FIG. 2.

Figure 5:
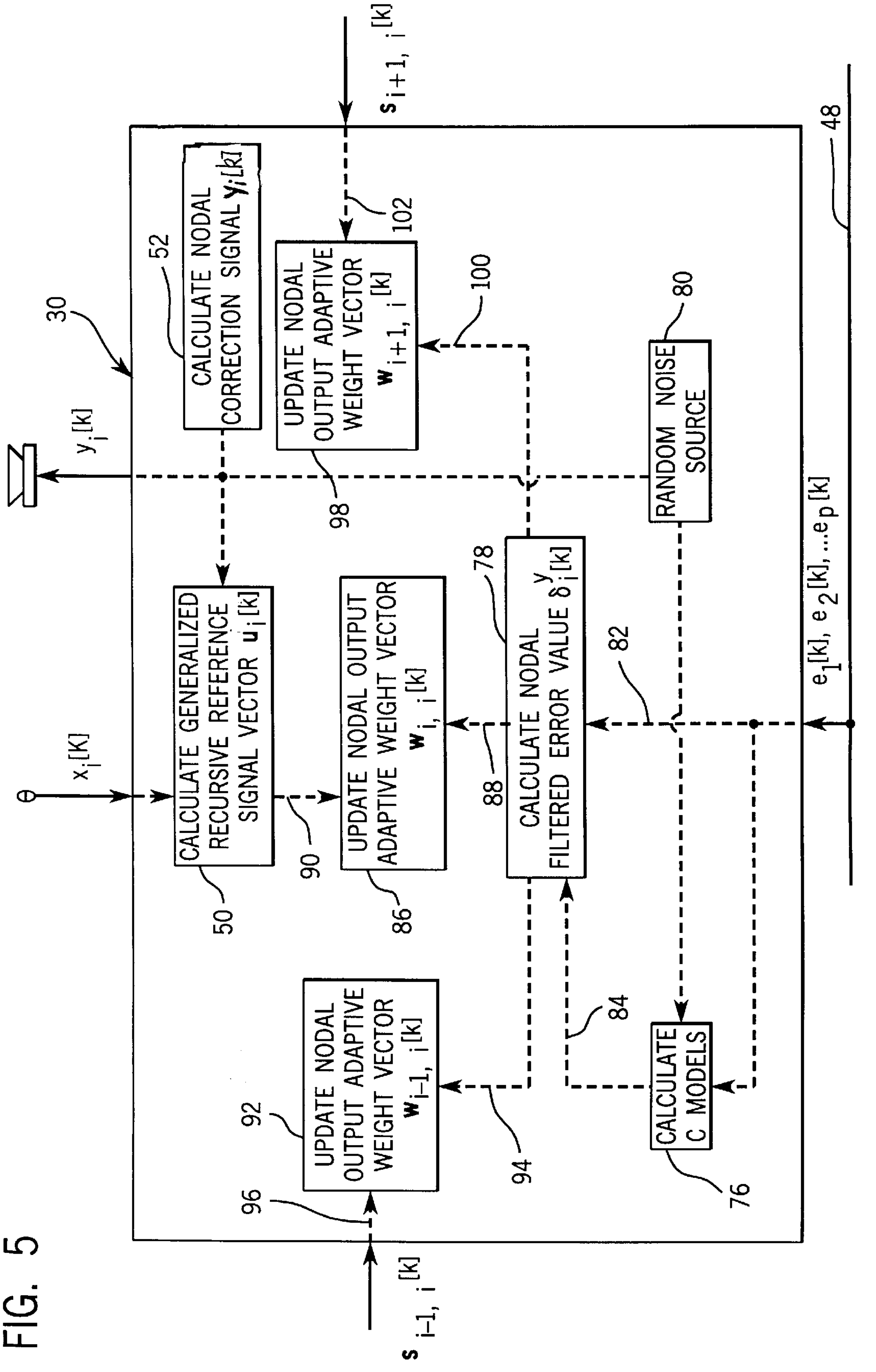

FIG. 5 illustrates the adaptation of nodal output adaptive weight vectors for the system shown in FIG. 2.

Figure 6:
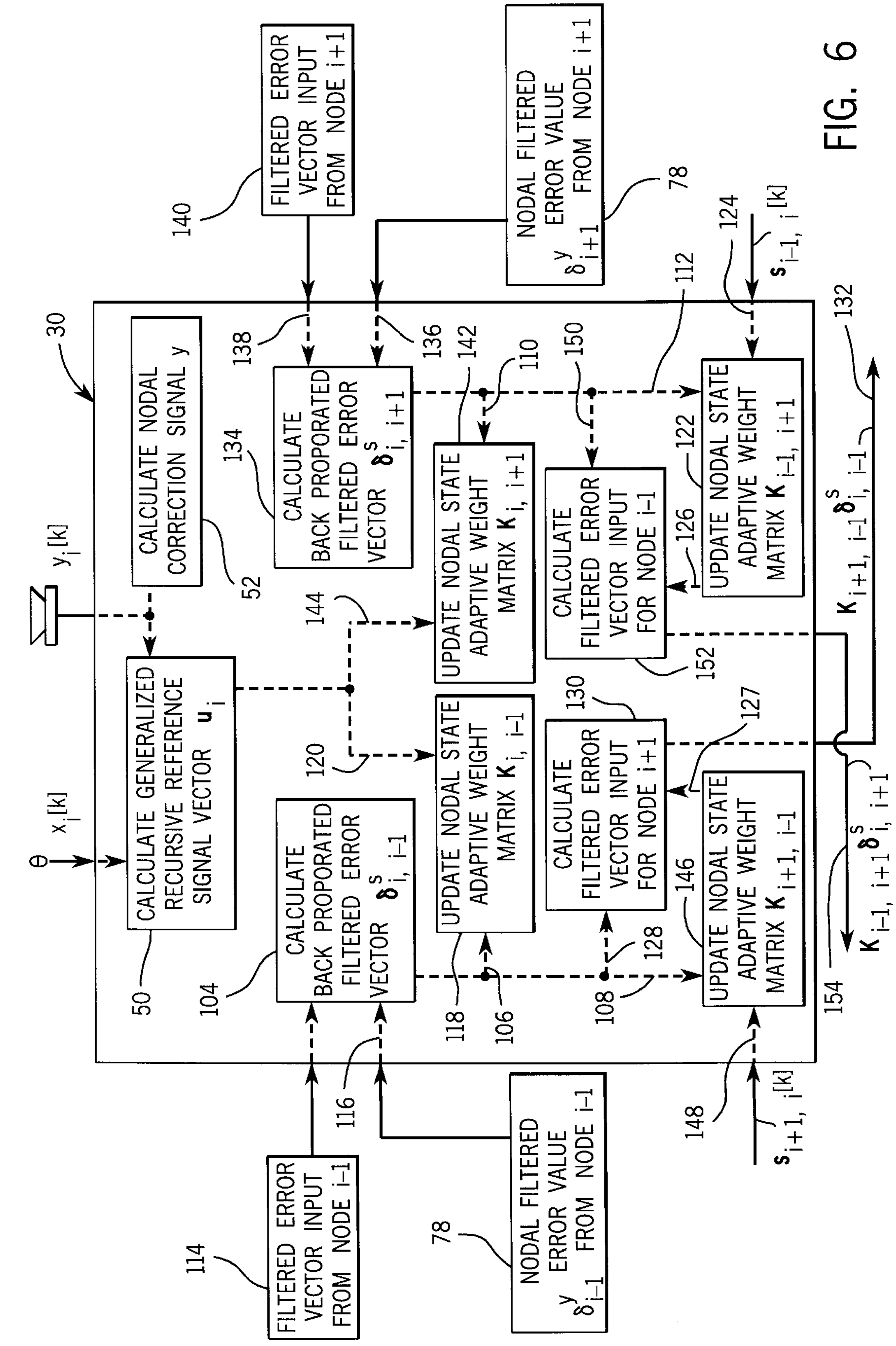

FIG. 6 illustrates the adaptation of nodal state adaptive weight matrices for the system shown in FIG. 2.

Figure 7:
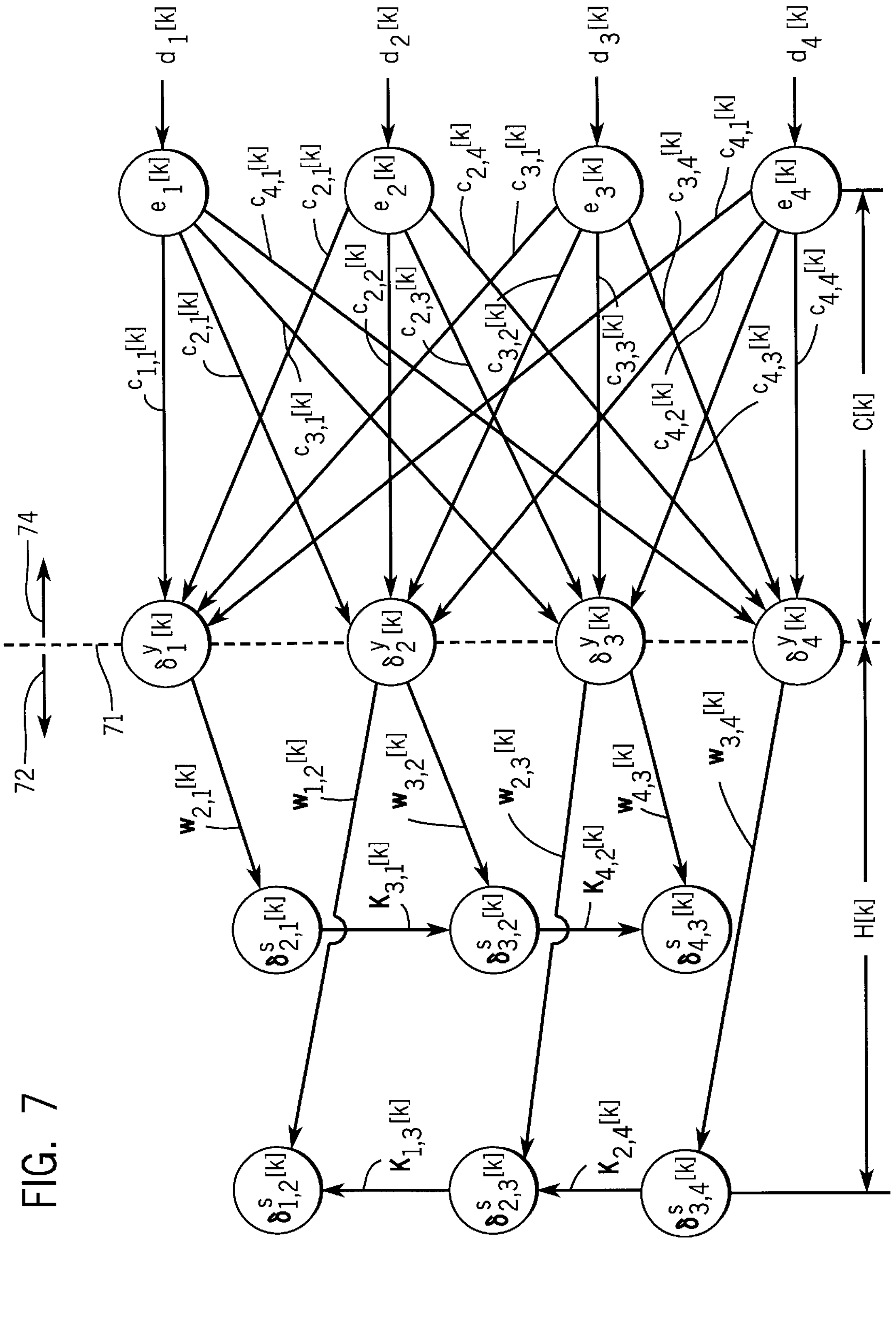

FIG. 7 illustrates back propagation of filtered error signals through the appropriate acoustic and electrical paths of a 4×4×4 multiple input multiple output system in accordance with FIG. 2.

Figure 8:
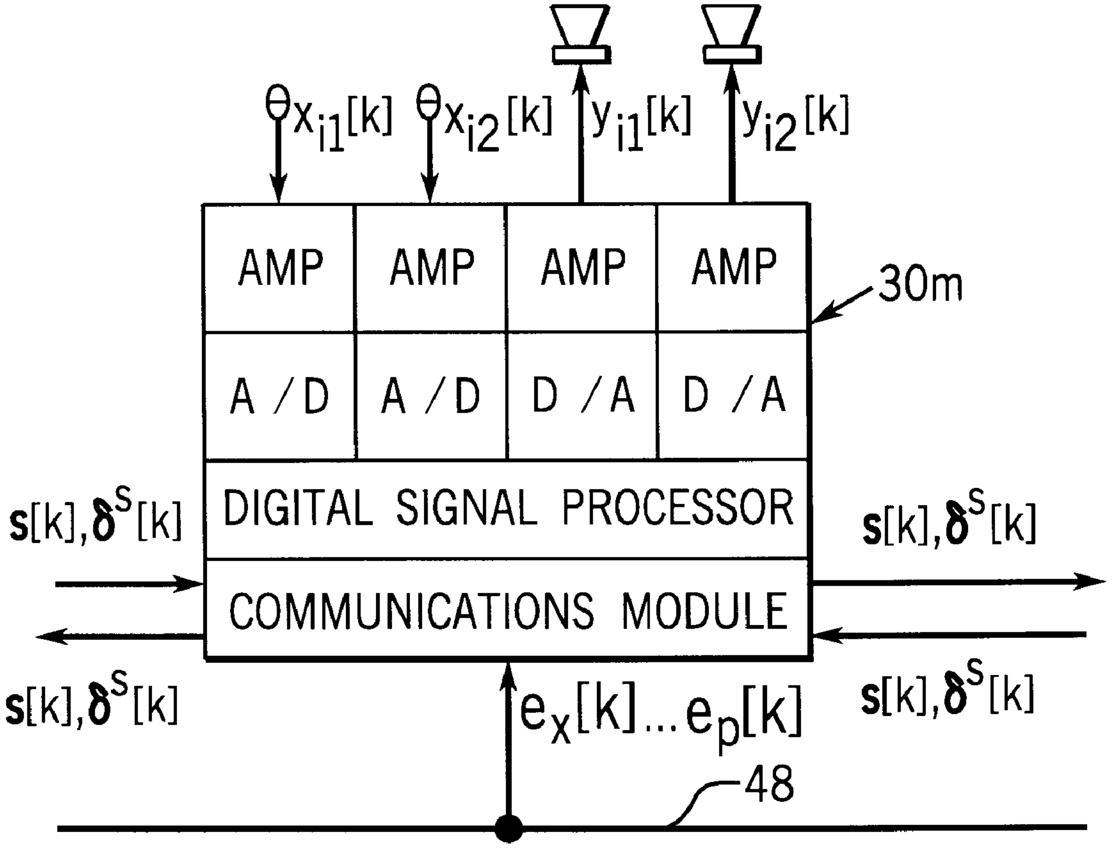

FIG. 8 illustrates another embodiment of an adaptive filter node for the system shown in FIG. 2 in which the node receives a plurality of reference signals, and generates a plurality of correction signals.

Figure 9:
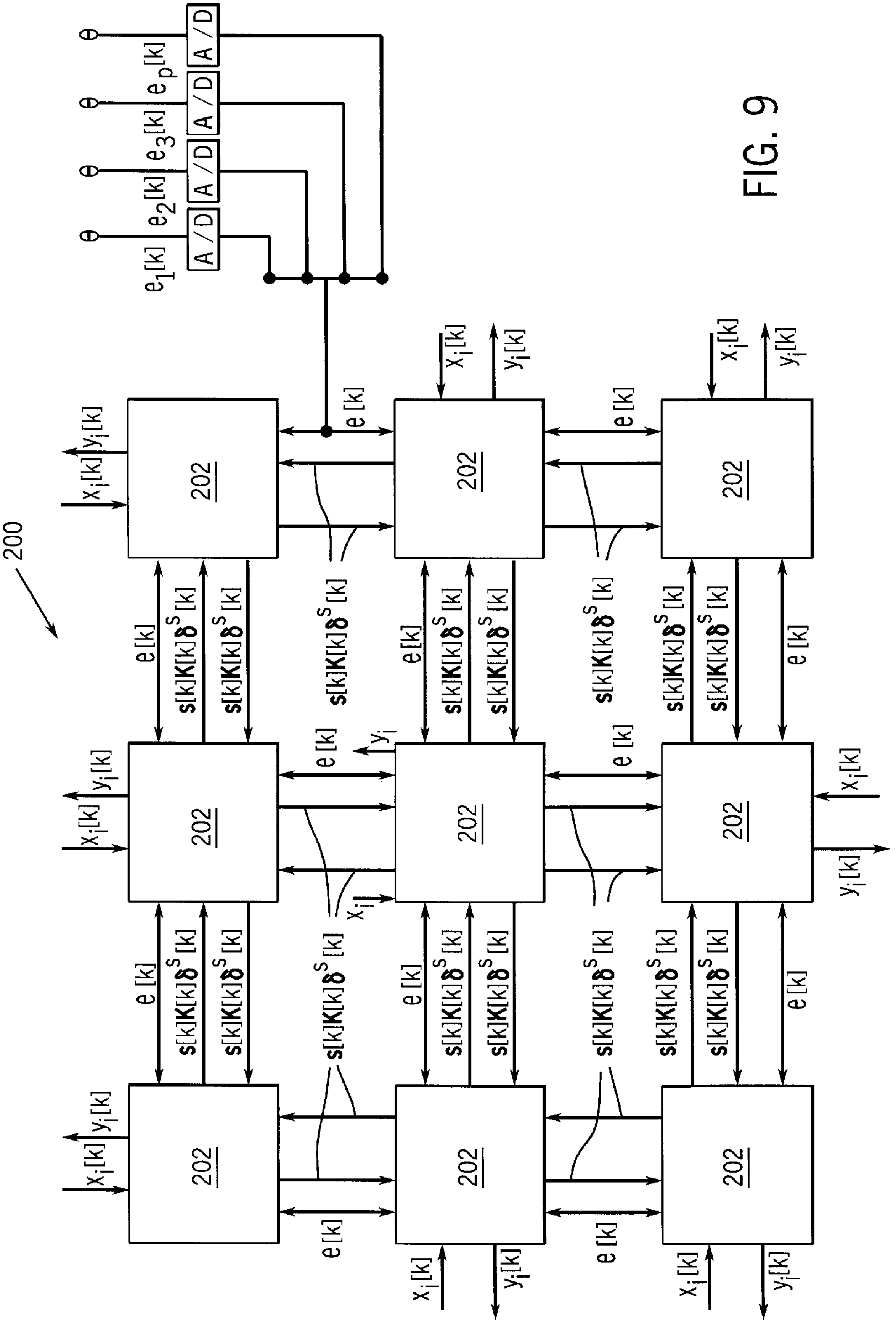

FIG. 9 illustrates a second embodiment of the invention using a rectangular network topology.

Figure 10:
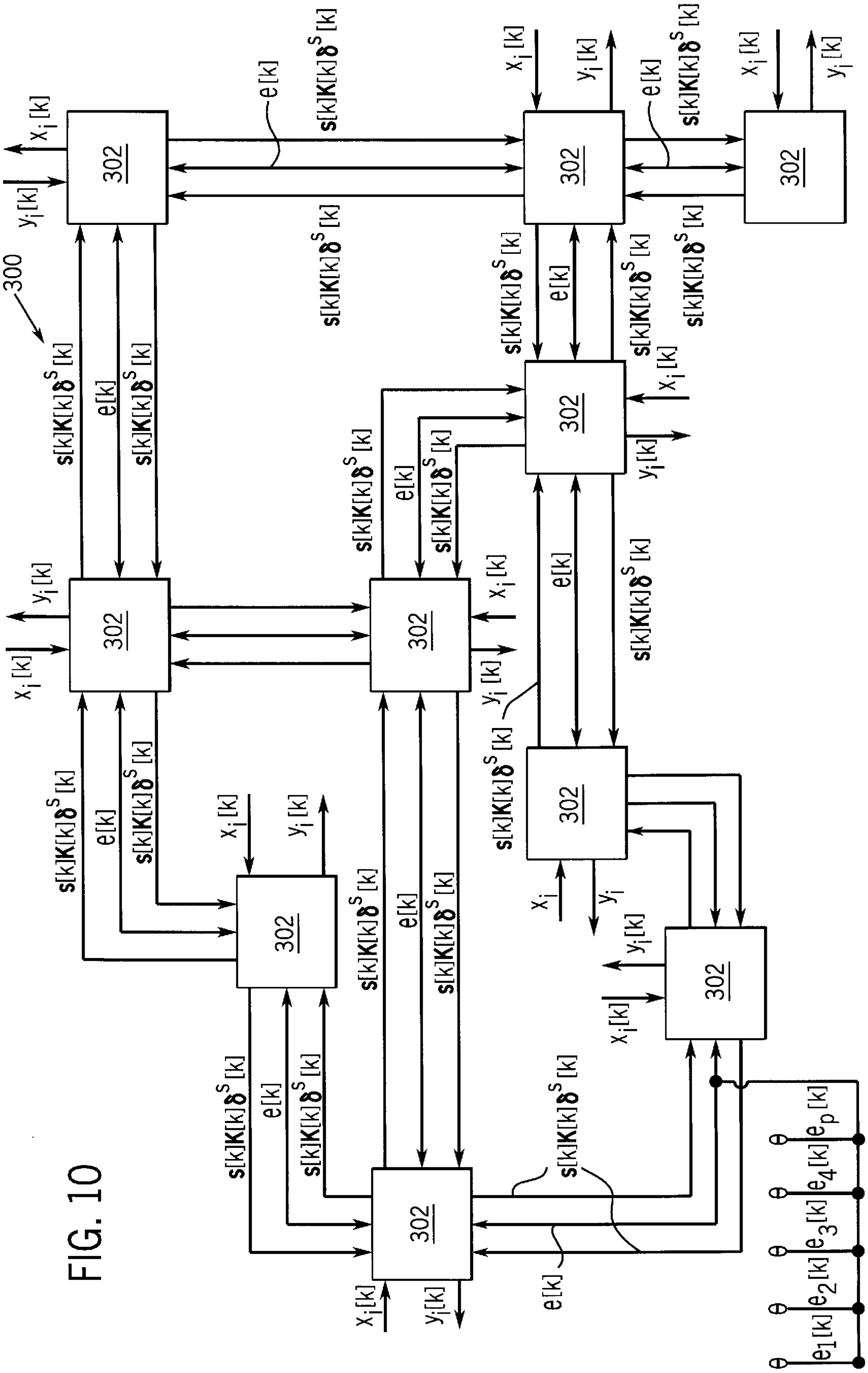

FIG. 10 illustrates a third embodiment of the invention utilizing a random web network topology.

DETAILED DESCRIPTION OF THE DRAWINGS

Prior Art

Figure 1:
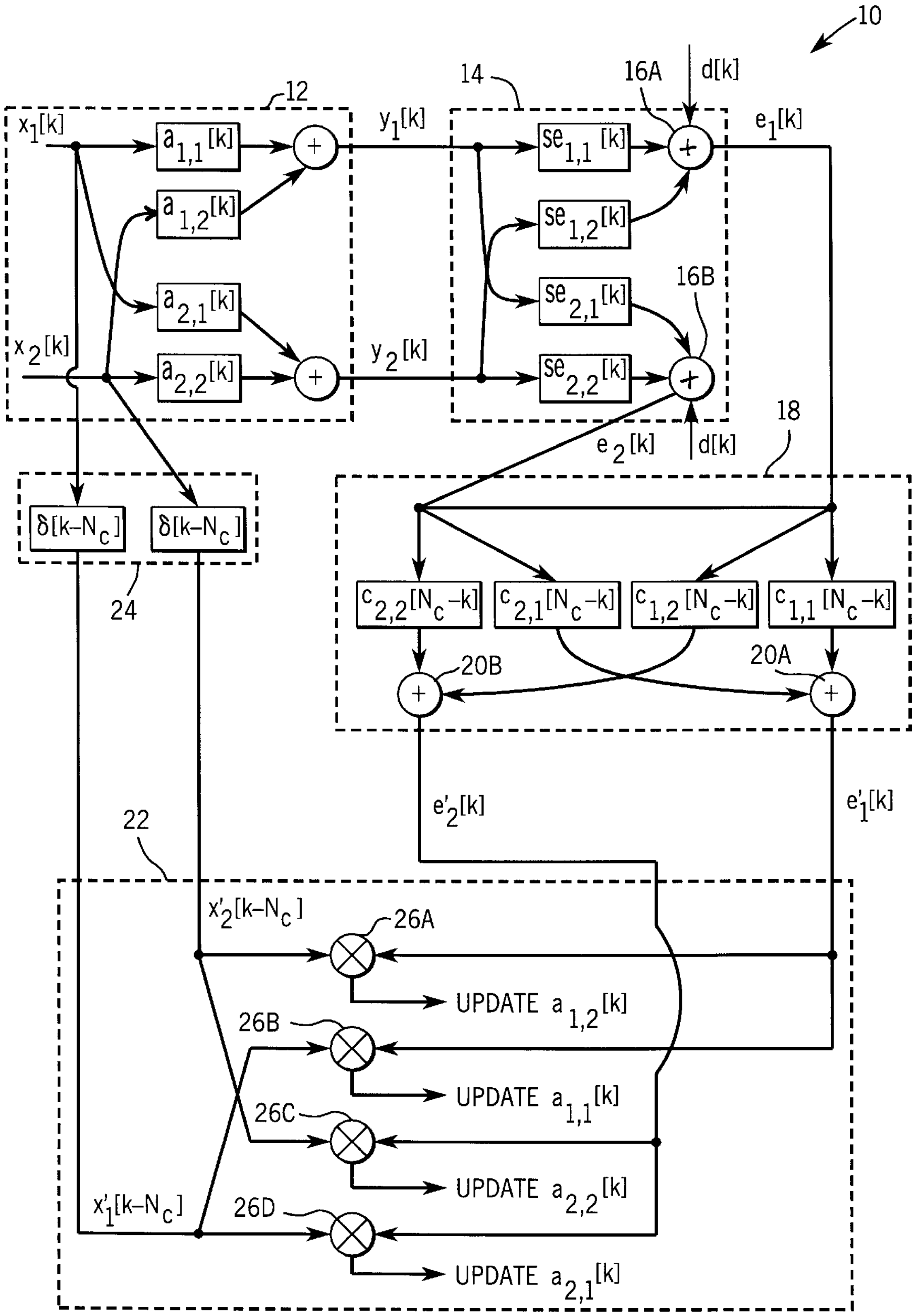
FIG. 1 illustrates a centralized multiple input multiple output adaptive control system for an active acoustic attenuation system in accordance with copending U.S. patent application Ser. No. 08/297,241 entitled "Adaptive Control System With A Corrected Phase Filtered Error Update", filed Aug. 25, 1995, by Steven R. Popovich, which is incorporated herein by reference.

FIG. 1 illustrates a feedforward 2×2×2 multiple input multiple output adaptive active acoustic attenuation system 10 having a centralized MIMO controller 12 as disclosed in allowed copending patent application Ser. No. 08/297,241, now U.S. Pat. No. 5,590,205, entitled "Adaptive Control System With Corrected-Phase Filtered Error Update" by Steven R. Popovich, filed on Aug. 25, 1994, which has been incorporated herein by reference. In general, the prior art MIMO system has m reference signals, n correction signals and p error signals (i.e., m×n×p), and the 2×2×2 system shown in FIG. 1 is illustrative of the generalized m×n×p system. The MIMO system 10 has two reference signals $x_1[k]$ and $x_2[k]$ which input a multi-channel adaptive FIR filter 12. The multi-channel adaptive filter 12 outputs two correction signals $y_1[k]$ and $y_2[k]$. The multi-channel adaptive filter 12 has 2×2 adaptive channels which are labeled $a_{11}$, $a_{12}$, $a_{21}$ and $a_{22}$. Normally, the adaptive filter channels $a_{11}$, $a_{12}$, $a_{21}$ and $a_{22}$ are contained within a centralized digital signal processor. The correction signals $y_1[k]$ and $y_2[k]$ are transmitted to an auxiliary path 14. The correction signals $y_1[k]$ and $y_2[k]$ propagate through the auxiliary path, and combine with acoustic disturbances in the acoustic plant to yield a system output which is sensed by two error sensors 16A, 16B to generate error signals $e_1[k]$ and $e_2[k]$. The auxiliary paths $se_{11}$, $se_{12}$, $se_{21}$, and $se_{22}$ are shown as speaker-error paths, thus indicating that the correction signals $y_1[k]$ and $y_2[k]$ input loudspeakers which output a secondary input acoustic wave into the acoustic plant in response to the correction signals $y_1[k]$ and $y_2[k]$. The auxiliary path 14 is preferably modeled on-line with a multi-channel C model having 2×2 (i.e., p×n) adaptive channels such as disclosed in U.S. Pat. Nos. 5,216,721 and 5,216,722, and 4,677,676. The p×n notation is convenient to represent a p×n matrix that operates on n×1 vector of outputs y to result in a p×1 vector at the error sensors 16A, 16B.

The two (i.e., p) error signals $e_1[k]$ and $e_2[k]$ input the error signal filter 18. The error signal filter 18 outputs two (i.e., n) filtered error signals $e'_1[k]$ and $e'_2[k]$. The error signal filter 18 has 2×2 (i.e., p×n) filter channels $c_{22}$, $c_{21}$, $c_{12}$, and $c_{11}$. The error signal filter 18 also has two (i.e., n) summers 20A, 20B that sum the output from the individual filter channels $c_{22}$, $c_{21}$, $c_{12}$, and $c_{11}$ to generate the filtered error signals $e'_1[k]$ and $e'_2[k]$, respectively. The filter channels $c_{22}$, $c_{21}$, $c_{12}$, and $c_{11}$ are preferably determined by transposing the channels of the C model of the auxiliary path 14, and taking the delayed complex conjugate of each channel as described in the above incorporated copending patent application Ser. No. 08/297,241. The filtered error signals $e'_1[k]$ and $e'_2[k]$ output the error signal filter 18 and input a correlator 22. The correlator 22 outputs 2×2 (i.e., m×n) error input signals $e''[k]$ to update the 2×2 (i.e., m×n) adaptive channels $a_{11}$, $a_{12}$, $a_{22}$, and $a_{21}$ in the multi-channel adaptive filter model 12. Each of the reference signals $x_1[k]$ and $x_2[k]$ are delayed in delay element 24 to generate delayed reference signals $x'_1[k-N_c]$ and $x'_2[k-N_c]$ which are regressor input to the correlator 22. The correlator 22 has 2×2 (i.e., m×n) multipliers 26A, 26B, 26C, and 26D that multiply the appropriate regressor $x'_1[k-N_c]$ and $x'_2[k-N_c]$ with the appropriate filtered error signal $e'_1[k]$ and $e'_2[k]$ to generate an error input signal to update the appropriate adaptive channel in the adaptive filter model 12.

The copending patent application Ser. No. 08/297,241 explains that the centralized MIMO adaptive filter model can be either a multi-channel FIR model, or a multi-channel recursive IIR filter model. While the system 10 shown in FIG. 1 has certain advantages, namely reduced processing requirements in contrast to conventional filtered-X systems in certain applications, the system 10 typically implements all adaptation and filter processing within a centralized MIMO controller. In general, the system 10 needs to be reconfigured and software needs to be rewritten to add an additional input sensor, output actuator, or error sensor. However, the system 10 is robust in that the multi-channel adaptive filter model 12 should be able to adapt to circumstances in which an input sensor or an output actuator are lost from the system.

The system disclosed in U.S. Pat. No. 5,570,425 to Goodman et al. entitled "Transducer Daisy Chain" assigned to the assignee of the present application, issued on Oct. 29, 1996 can be used to reduce the amount and weight of cabling in the system 10. The system described in U.S. Pat. No. 5,557,682 to Warner et al. entitled "Multi-Filter-Set Active Adaptive Control System" issued on Sep. 17, 1996, and assigned to the assignee of the present application can be used when the system 10 needs more input/output or processing capabilities. U.S. Pat. Nos. 5,570,452 and 5,557,682 are incorporated herein by reference.

Present Invention

FIGS. 2–7 illustrate a first embodiment of an adaptive acoustic attenuation system 28 in accordance with the invention having distributed processing and a shared state nodal architecture.

Referring in particular to FIG. 2, the system 28 includes a plurality of J adaptive filter nodes 30A, 30B, 30C, 30D, and 30J arranged in a linear topology. Each adaptive filter node includes a communications module 32 and a digital signal processor 34. Each node also preferably includes a digital-to-analog (D/A) converter 36 and an amplifier 38 which amplifies analog output from the D/A converter 36. In addition, each adaptive filter node also preferably includes an analog-to-digital (A/D) converter 40 which receives amplified input from amplifier 42.

The digital signal processors 34 are preferably either Texas Instruments TMS 320C30 or TMS 320C40 digital signal processors. Alternatively, it may be desirable to use digital signal processors having mixed signal processing, or even if possible, low cost microcontrollers. In any event, it is desirable that the nodal digital signal processors 30 provide both processing capabilities and memory.

At least one of the adaptive filter nodes 30A, 30B, 30C, 30D . . . 30J, and preferably all of the adaptive filter nodes 30 are associated with an acoustic actuator 44A, 44B, 44C, 44D, 44J. The nodal digital signal processor 30 generates a digital correction signal in accordance with nodal output adaptive parameters (e.g. nodal output adaptive weight vector $W_{j,k}[k]$). The digital correction signal is converted to an analog signal by D/A converter 36, amplified by amplifier 38 and output as an analog correction signal $y_1[k]$, $y_2[k]$, $y_3[k]$ . . . $y_{J-1}[k]$, $y_J[k]$. Preferably, each of the acoustic actuators 44A, 44B, 44C, 44D, 44J are active acoustic actuators, although passive adaptive acoustic attenuation devices (e.g. adjustable tuners) can be used with respect to one or more nodes. In an active acoustic attenuation system, the active acoustic actuators 44 are preferably loudspeakers and/or electromechanical shakers which inject secondary input (i.e., cancelling acoustic waves) into the acoustic plant in response to the respective correction signal $y_i[k]$.

A plurality of error sensors 46A, 46B, 46C . . . 46P sense acoustic disturbances in the acoustic plant and generate error signals $e_1[k]$, $e_2[k]$, $e_3[k]$ . . . $e_p[k]$. The error signals $e_1[k]$ . . . $e_p[k]$ are transmitted globally to the adaptive filter nodes 30A, 30B, 30C . . . 30D, 30J by common bus 48.

Each adapter filter node 30 (e.g., 30A) generates at least one nodal state signal vector $s_{i,k}[k]$ (e.g., $s_{1,2}[k]$) that is transmitted directly to at least one other adaptive filter node (e.g., 30B). The nodal state signal vectors (e.g., $s_{1,2}[k]$) are generated within the nodal digital signal processor 34 in accordance with nodal state adaptive parameters (e.g. nodal state adaptive weight matrix $K_{j,k}[k]$. Both the nodal state adaptive parameters (which are used to generate the nodal state signal vector $s_{j,k}[k]$) and the nodal output adaptive parameters (which are used to generate correction signals $y_i[k]$) are updated in accordance with at least one of the globally transmitted error signals $e_1[k]$ . . . $e_p[k]$.

In general, it is preferred that each of the adaptive filter nodes 30 receive a reference signal $x_i[k]$. FIG. 2 shows each adaptive filter node 30A, 30B, 30C, 30D, . . . 30J receiving a reference signal $x_1[k]$, $x_2[k]$, $x_3[k]$ . . . $x_{J-1}[k]$, $x_J[k]$ from a respective microphone 48A, 48B, 48C, 48D, and 48J. The analog reference signal $x_i[k]$ inputs the adaptive filter node 30, is amplified by amplifier 42 and converted into a digital signal by A/D converter 40. The digital reference signal inputs the digital signal processor 34. The reference signals $x_1[k]$, $x_2[k]$, $x_3[k]$ . . . $x_{J-1}[k]$, $x_J[k]$ are shown in FIG. 2 as being generated by separate microphones 48A, 48B, 48C, 48D, 48J, but it may be desirable for the reference signal input $x_i[k]$ for some or all of the adaptive filter nodes 30 to be transmitted from the same source.

FIG. 3 illustrates the calculations within the digital signal processor 34 of the $i^{th}$ adaptive filter node 30 to generate the nodal correction signal $y_i[k]$ and the nodal state signal vectors $s_{i,i-1}[k]$ and $s_{i,i+1}[k]$. Block 50 illustrates that nodal reference signal $x_i[k]$ and nodal correction signal $y_i[k]$ are used to calculate a generalized recursive reference signal vector $u_i[k]$ which is given by $[x_i[k] \ldots x_i[k-M+1]\ y_i[k-1] \ldots y_i[k-M]]^T$. It is not necessary that the reference signal vector $u_i[k]$ be a recursive reference signal vector, however, it is preferred. The tap length of the recursive nodal reference signal vector $u_i[k]$ is $2\times(M+1)$.

Nodal state signal vectors $s_{i-1,i}[k]$ and $s_{i+1,i}[k]$ input the $i^{th}$ adaptive filter node 30 from adjacent adaptive filter nodes. The purpose of the nodal state signal vectors $s_{i-1,i}[k]$ and $s_{i+1,i}[k]$ entering the $i^{th}$ adaptive filter node is to pass information to the $i^{th}$ adaptive filter node 30 from adjacent nodes, and even information from more remote nodes via the adjacent nodes. The length of the nodal state signal vectors $s_{j,k}[k]$ can be important. For instance, if the length of $s_{j,k}[k]$ is equal to the number of reference inputs $x_i[k]$, then the nodal state signal vectors should be able to communicate all reference signal information to all adaptive filter nodes 30 within the system 28. On the other hand, if the nodal state signal vectors $s_{j,k}[k]$ are short, system 28 performance may be compromised due to insufficient coupling of remote nodes having an effect on one another. It has been found that the system 28 converges faster if the nodal state signal vectors $s_{j,k}[k]$ are about the same length as the number of statistically independent reference inputs.

Block 52 in FIG. 3 illustrates that the nodal correction signal $y_i[k]$ is calculated based on the nodal reference signal vector $u_i[k]$, line 54, and the nodal state signal vectors $s_{i-1,i}[k]$, line 56, and $s_{i+1,i}[k]$, line 58 received from the adjacent adaptive filter nodes. To calculate the nodal correction signal $y_i[k]$, the nodal reference signal vector $u_i[k]$ is multiplied by the nodal output adaptive weight vector $w_{i,i}[k]$ and the nodal state signal vector $s_{i-1,i}[k]$ is multiplied by nodal output adaptive weight vector $w_{i-1,i}[k]$, nodal state signal vector $s_{i+1,i}[k]$ is multiplied by nodal output adaptive weight vector $w_{i+1,i}[k]$ and the results are added together to form the nodal correction signal $y_i[k]$. Thus, the correction signal $y_i[k]$ is a scalar value generated in accordance with the following expression:

$$y_i[k]=w^T_{i,i}[k]u_i[k]+w^T_{i-1,i}[k]s_{i-1,i}[k]+w^T_{i+1,i}[k]s_{i+1,i}[k] \quad \text{(Eq. 1)}$$

where $y_i[k]$ is a scalar correction signal value, $u_i[k]$ is a generalized recursive nodal reference signal vector, $w^T_{i,i}[k]$ is the transpose of the nodal output adaptive weight vector which filters the nodal reference signal vector $u_i[k]$; $s_{i\pm1,i}[k]$ are nodal state signal vectors transmitted from adjacent adaptor filter nodes to the $i^{th}$ adaptive filter node, $w^T_{i\pm1,i}[k]$ are the nodal output adaptive weight vectors that transform state input from adjacent adaptive filter nodes into information used to generate the correction signal $y_i[k]$ for the $i^{th}$ adaptive filter node. It can therefore be appreciated that the value of the correction signal $y_i[k]$ depends not only on reference signal input $x_i[k]$ to the $i^{th}$ adaptive filter node 30, but also depends on information communicated to the $i^{th}$ adaptive filter node 30 via the nodal state signal vectors $s_{i-1,i}[k]$ and $s_{i+1,i}[k]$.

The $i^{th}$ adaptive filter node 30 also generates nodal state signal vectors $s_{i,i-1}[k]$ and $s_{i,i+1}[k]$ which are transmitted to the respective adjacent adaptive filter nodes. Block 60 illustrates that the calculation of nodal state signal vector $s_{i,i-1}[k]$ depends on the nodal reference signal vector $u_i[k]$, line 62, and the nodal state signal vector $s_{i+1,i}[k]$, line 64, from the other adjacent adaptive filter node. In particular, the nodal state signal vector $s_{i,i-1}[k]$ is generated in accordance with the following expression:

$$s_{i,i-1}[k]=K_{i,i-1}[k]u_i[k]+K_{i+1,i-1}[k]s_{i+1,i}[k] \quad \text{(Eq. 2)}$$

where $s_{i,i-1}[k]$ is the nodal state signal vector transmitted from the $i^{th}$ adaptive filter node to an adjacent i−1 adaptive filter node; $u_i[k]$ is the nodal reference signal vector; $K_{i,i-1}[k]$ is a nodal state adaptive weight matrix that filters the nodal reference signal vector $u_i[k]$; $s_{i+1,i}[k]$ is the nodal state signal vector from the other adjacent adaptive filter node (i+1); and $K_{i+1,i-1}[k]$ is a nodal state adaptive weight matrix which filters the nodal state signal vector $s_{i+1,i}[k]$.

Block 66 illustrates that the calculation of the nodal state signal vector $S_{i,i+1}[k]$ depends on the nodal reference signal vector $u_i[k]$, line 68, and the nodal state signal vector $s_{i-1,i}[k]$ from the other adjacent adaptive filter node (i−1). In particular, the nodal state signal vector $s_{i,i+1}[k]$ is generated in accordance with the following expression:

$$s_{i,i+1}[k]=K_{i,i+1}[k]u_i[k]+K_{i-1,i+1}[k]s_{i-1,i}[k] \quad \text{(Eq. 3)}$$

where $s_{i,i+1}[k]$ is the nodal state signal vector transmitted from the $i^{th}$ adaptive filter node to an adjacent i−1 adaptive filter node; $u_i[k]$ is the nodal reference signal vector; $K_{i,i+1}[k]$ is a nodal state adaptive weight matrix that filters the nodal reference signal vector $u_i[k]$; $s_{i-1,i}[k]$ is the nodal state signal vector from the other adjacent adaptive filter node (i-1); and $K_{i-1,i+1}[k]$ is a nodal state adaptive weight matrix which filters the nodal state signal vector $s_{i-1,i}[k]$.

FIG. 4 shows the electrical and acoustic paths between the reference signals $u_i[k]$, the correction signals $y_i$ and error signals $e_1[k]$, $e_2[k]$, $e_3[k]$, and $e_4[k]$ for a 4×4×4 system. The electrical paths H[k] are located left of the dotted line passing through the correction signal symbols $y_1[k]$, $y_2[k]$, $y_3[k]$, and $y_4[k]$ as indicated by arrow labeled 72. The electrical paths are labeled $w_{j,k}[k]$ and $K_{j,k}[k]$ where $w_{j,k}[k]$ represents nodal output adaptive weight vectors which transform input in the form of nodal reference signal vectors $u_j[k]$ or nodal state signal vectors $s_{j,k}[k]$ from adjacent adaptive filter nodes, into information used to calculate nodal correction signals $y_k[k]$; and $K_{j,k}[k]$ represents nodal state adaptive weight matrices which transform nodal input in the form of nodal reference signal vectors $u_i[k]$ and nodal state signal vectors $s_{j,k}[k]$ from adjacent adaptive filter nodes into nodal state signal vectors $s_{j,k}[k]$ transmitted to the other adjacent adaptive filter node. The nodal state adaptive weight matrices $K_{j,k}[k]$ carry through coupling between the inputs and outputs of various remote nodes. Experimentation has shown that elements in the nodal state adaptive weight matrix $K_{j,k}[k]$ adapt towards zero if the respective components are not coupled.

Depending on the coupling between nodes (i.e., the values within the nodal state adaptive weight matrices $K_{j,k}[k]$), the generation of each correction signal $y_i[k]$ depends directly upon the nodal reference signal vector $u_i[k]$ for the $i^{th}$ node, but also depends indirectly on the nodal reference signals $u_{i\pm1}[k]$, $u_{i\pm2}[k]$, etc. for the other adaptive filter nodes through state signal vector $s_{j,k}[k]$. For example, correction signal $y_1[k]$ depends directly on nodal reference signal $u_1[k]$ (i.e., $w_{1,1}[k]$, $u_1[k]$), and also depends on nodal state signal vector $s_{2,1}[k]$ (i.e., $w_{2,1}[k]$, $s_{2,1}[k]$). The nodal state signal vector $s_{2,1}[k]$ depends on nodal reference signal vector $u_2[k]$ and indirectly on nodal reference signal vectors $u_3[k]$ and $u_4[k]$. The correction signal $y_1[k]$ depends indirectly on nodal reference signals $u_2[k]$, $u_3[k]$, and $u_4[k]$. Nodal state signal vector $s_{2,1}[k]$ depends directly on nodal reference signal vector $u_2[k]$ (i.e., $K_{2,1}[k]$ $u_2[k]$), and on nodal state signal vector $s_{3,2}[k]$ (i.e., $K_{3,1}[k]$ $s_{3,2}[k]$). Nodal state signal vector $s_{3,2}[k]$ depends directly on nodal reference signal vector $u_3$ (i.e., $K_{3,2}[k]$ $u_3[k]$), and also depends on nodal state signal vector $s_{4,3}[k]$ (i.e., $K_{4,2}[k]$ $s_{4,3}[k]$). Nodal state signal vector $s_{4,3}[k]$ depends directly on nodal reference signal vector $u_4[k]$ (i.e., $K_{4,3}[k]$ $u_4[k]$).

In FIGS. 4 and 7, the acoustic paths are labelled C[k] and the electrical paths are labelled H[k]. The acoustic paths C[k] are represented to the right side of the dotted line 71 as indicated by arrow 74. Each correction signal $y_i[k]$ generates acoustic output via an acoustic actuator which is transmitted through the acoustic plant to the several error sensors. Thus, each error sensor senses the combination of the secondary acoustic input from the acoustic actuators as well as the acoustic disturbance present at the error sensor. For instance, error signal $e_1[k]$ represents the combination of correction signal $y_1[k]$ passing through path $c_{1,1}[k]$, correction signal $y_2[k]$ passing through path $c_{2,1}[k]$, correction signal $y_3[k]$ passing through path $C_{3,1}[k]$, correction signal $y_4[k]$ passing through path $c_{4,1}[k]$, and the acoustic disturbance in the plant $d_1[k]$.

FIGS. 5 and 6 illustrate adaptation of the nodal output adaptive weight vectors $w_{j,k}$ and the nodal state adaptive weight matrices $K_{j,k}[k]$ for the $i^{th}$ adaptive filter node 30. In particular, FIG. 5 illustrates updating the nodal output adaptive weight vectors $w_{j,k}[k]$, and FIG. 6 illustrates updating the nodal state adaptive weight matrices $K_{j,k}[k]$. Referring to FIG. 5, the nodal output adaptive weight vectors $w_{j,k}[k]$ are updated in accordance with the error signals $e_1[k]$, $e_2[k]$, . . . $e_p[k]$ back-filtered through the appropriate electronic and acoustic paths. The error signals $e_1[k]$, $e_2[k]$, . . . $e_p[k]$ input the $i^{th}$ adaptive filter node 30 from common bus 48, and are used to calculate C models of the appropriate acoustic paths (block 76) and to calculate nodal filtered error values $\delta^y_i[k]$ (block 78). Each node computes the C paths that the node needs from the error signals which are globally available. The C models are preferably calculated on-line using random noise from random noise source 80 as disclosed in U.S. Pat. No. 4,677,676 incorporated herein by reference. Block 78 illustrates that the calculation of the nodal filtered error value $\delta^y_i[k]$ depends on the error signals $e_1[k] \ldots e_p[k]$, line 82, and the appropriate C models $c_{i,j}[k]$, line 84. In particular, the nodal filtered error values $\delta^y_i[k]$ are calculated in accordance with the following expression:

$$\delta_i^y[k] = -\sum_{l=1}^{J} [e_l[k], e_l[k+1], \ldots, e_l[k+N]] c_{i,l}[k] \quad \text{(Eq. 4)}$$

where $c_{i,1}[k]$ represents the length N impulse response of path associated with the $1^{th}$ error sensor from the actuator receiving the correction signal $y_i[k]$ output from the $i^{th}$ node 30.

Block 86 illustrates that the nodal output adaptive weight vector $w_{i,i}[k]$ depends on the nodal filtered error value $\delta^y_i[k]$, line 88, and on the nodal reference signal vector $u_i[k]$, line 90. In particular, the nodal output adaptive weight vector $w_{i,i}[k]$ is updated in accordance with the following expression:

$$w_{i,i}[k+1]=w_{i,i}[k]-\eta\delta^y_i[k-N]u_i[k-N] \quad \text{(Eq. 5)}$$

where $\eta$ is a step size parameter.

Block 92 illustrates that the update for the nodal output adaptive weight vector $w_{i-1,i}[k]$ depends on the nodal filtered error value $\delta^y_i[k]$, line 94, and the nodal state signal vector $s_{i-1,i}[k]$ from an adjacent adaptive filter node, line 96. Block 98 illustrates that the nodal output adaptive weight vector $w_{i+1,i}[k]$ depends on the nodal filtered error value $\delta^y_i[k]$, line 100, and the nodal state signal vector $s_{i+1,i}[k]$ from the adjacent adaptive filter node, line 102. In particular, the nodal output adaptive weight vectors $w_{i\pm1,i}[k]$ are adapted in accordance with the following expression:

$$w_{i\pm1,i}[k+1]=w_{i\pm1,i}[k]-\eta\delta^y_i[k-N]s_{i\pm1,i}[k-N] \quad \text{(Eq. 6)}$$

Referring to FIG. 6, the nodal state adaptive weight matrices $K_{j,k}[k]$ are calculated in accordance with back-propagated filtered error vectors $\delta^s_{j,k}[k]$. Block 104 illustrates that the back-propagated filtered error vector $\delta^s_{i,i-1}[k]$ is used to update nodal state adaptive weight matrix $K_{i,i-1}[k]$, line 106, and update nodal state adaptive weight matrix $K_{i+1,i-1}[k]$, line 108. Likewise, the back-propagated filtered error vector $\delta^s_{i,i+1}[k]$ is used to update nodal state adaptive weight matrices $K_{i,i+1}[k]$, line 110, and update nodal state adaptive weight matrices $K_{i-1,i+1}[k]$, line 112.

Block 114 illustrates that filtered error vector input from adjacent adaptive node i−1 is transmitted to the $i^{th}$ adaptive filter node 30 to calculate the back-propagated filtered error vector $\delta^s_{i,i-1}[k]$. The filtered error vector input from the i−1 adjacent adaptive filter node is given by the following expression:

$$K_{i,i-2}^T\delta^s_{i-1,i-2}[k] \quad \text{(Eq. 7)}$$

The calculated nodal filtered error value $\delta^y_i[k]$, block 78 (see FIG. 5 and description thereof) is also used, line 116, to calculate the back-propagated filtered error vector $\delta^s_{i,i-1}[k]$. In particular, the back-propagated filtered error vector $\delta^s_{i,i-1}[k]$ is given by the following expressions:

$$\delta^s_{i,i-1}[k]=\delta^y_1[k-N]w_{2,1}[k] \text{ for } i=2 \quad \text{(Eq. 8)}$$

$$\delta^s_{i,i-1}[k]=\delta_{i-1}{}^y[k-N]w_{i,i-1}[k]+K^T_{i,i-2}, \delta^s_{i-1,i-2}[k] \text{ for } 3\leqq i\leqq J \quad \text{(Eq. 9)}$$

Note that the first adaptive filter node does not include nodal state adaptive weight matrices $K_{i,i-1}[k]$ or $K_{i-1,i+1}[k]$ and therefore a back-propagated filtered error vector $\delta^s_{1,0}[k]$ is not generated. Further, as indicated by Equation 8, the back-propagated filtered error vector $\delta^s_{2,1}[k]$ for the second filter node depends entirely on the calculated nodal filter error value $\delta^y_{i-1}[k]$ and the nodal output adaptive weight vector $w_{21}[k]$.

Block 118 illustrates that the nodal state adaptive weight matrices $K_{i,i-1}[k]$ are updated based on the back-propagated filtered error vector $\delta^s_{i,i-1}[k]$, line 106, and the nodal reference signal vector $u_i[k]$, line 120. In particular, the nodal state adaptive weight matrices $K_{i,i-1}[k]$ are updated in accordance with the following expression:

$$K_{i,i-1}[k+1]=K_{i,i-1}[k]-\eta\delta^s_{i,i-1}[k]u^T_i[k-N] \text{ for } 2\leqq i\leqq J \quad \text{(Eq. 10)}$$

where $\eta$ is a parameter step size. The value of $\eta$ in Equation 10 is not necessarily the same as the value of $\eta$ in equations 5 and 6. As described above with respect to FIG. 3 and Equation 2, the nodal state adaptive weight matrix $K_{i,i-1}[k]$ filters the nodal reference signal vector $u_i[k]$, and the resultant is a component of the nodal state signal vector $s_{i,i-1}[k]$ which is sent from the $i^{th}$ node to the i−1 node.

Block 146 illustrates that the update of the nodal state adaptive weight matrix $K_{i+1,i-1}[k]$ depends on the nodal state signal vector $s_{i+1,i}[k]$ from the i+1 adaptive filter node, line 148, and on the back-propagated filtered error vector $\delta^s_{i,i-1}[k]$, line 108. In particular, the nodal state adaptive weight matrix $K_{i+1,i-1}[k]$ is updated in accordance with the following expression:

$$K_{i+1,i-1}[k+1]=K_{i+1,i-1}[k]-\eta\delta^s_{i,i-1}[k]s^T_{i+1,i}[k-N] \quad \text{(Eq. 11)}$$

After the nodal state adaptive weight matrix $K_{i+1,i-1}[k]$ is updated, the updated matrix $K_{i+1,i-1}[k]$ is used, line 127, along with the calculated back-propagated filtered error vector $\delta^s_{i,i-1}[k]$, line 128, to calculate the filtered error vector input for adjacent adaptive filter node i+1 (block 130). The calculated filtered error vector input for adjacent adaptive filter node i+1 consists of $K_{i+1,i-1}[k]\ \delta^s_{i,i-1}[k]$, line 132.

Block 134 illustrates that the calculation of the back-propagated filtered error vector $\delta^s_{i,i+1}[k]$ depends on the nodal filtered error value $\delta^y_{i+1}[k]$ from adaptive filter node i+1, line 136, and filtered error vector input from adaptive filter node i+1, line 138 and block 140. The filtered error vector input represented by block 140 from adaptive filter node i+1 is represented by the following expression:

$$K_{i,i+2}[k]\delta^s_{i+1,i+2}[k] \quad \text{(Eq. 12)}$$

The back-projected filtered error vector $\delta^s_{i,i+1}[k]$ is calculated in accordance with the following expressions:

$$\delta^s_{i,i+1}[k]=\delta^y_J[k-N]w_{J-1,J}[k] \text{ for } i=J-1 \quad \text{(Eq. 13)}$$

$$\delta^s_{i,i+1}[k]=\delta^y_{i+1}[k-N]w_{i,i+1}[k]+K^T_{i,i+2}[k]\delta^s_{i+1,i+2}[k] \text{ for } 1\leqq i\leqq J-2 \quad \text{(Eq. 14)}$$

Note that for a system having J adaptive filter nodes a back-propagated filtered error vector $\delta^s_{J,J+1}[k]$ is not calculated. Also note that for the J−1 adaptive filter node 30D, the back-propagated filtered error vector $\delta^s_{J-1,J}[k]$ does not depend on filtered error vector input (block 140) from the $J^{th}$ node.

Block 142 illustrates that the update for the nodal state adaptive weight matrix $K_{i,i+1}[k]$ depends on the calculated back-propagated filtered error vector $\delta^s_{i,i+1}[k]$, line 110, and the nodal reference signal vector $u_i[k]$, line 144. In particular, the nodal state adaptive weight matrix $K_{i,i+1}[k]$ is updated in accordance with the following expression:

$$K_{i,i+1}[k+1]=K_{i,i+1}[k]-\eta\delta^s_{i,i+1}[k]u^T_i[k-N] \text{ for } 1\leq i\leq J-1 \quad \text{(Eq. 15)}$$

Block 122 illustrates that the update for the nodal state adaptive weight matrix $K_{i-1,i+1}[k]$ depends on the nodal state signal vector $s_{i-1,i}[k]$ from the i−1 adaptive filter node, line 124, and on the calculated back-propagated filtered error vector $\delta^s_{i,i+1}[k]$, line 112. In particular, the nodal state adaptive weight matrix $K_{i-1,i+1}[k]$ is updated in accordance with the following expression:

$$K_{i-1,i+1}[k+1]=K_{i-1,i+1}[k]-\eta\delta^s_{i,i+1}[k]s^T_{i-1,i}[k-N] \quad \text{(Eq. 16)}$$

After the nodal state adaptive weight matrix $K_{i-1,i+1}[k]$ has been updated, the updated nodal state adaptive weight matrix $K_{i-1,i+1}[k]$ is used (line 126) along with the calculated back- propagated filtered error vector $\delta^s_{i,i+1}[k]$ (line 150) to calculate the filtered error vector input for adjacent node i−1 (block 152). The calculated filtered error vector input for the adjacent adaptive filter node i−1 consists of $K_{i-1,i+1}[k]\ \delta^s_{i,i+1}[k]$, line 154.

FIG. 7 illustrates the back propagation of the error signals $e_1[k]$, $e_2[k]$, $e_3[k]$, and $e_4[k]$ through the appropriate acoustic and electrical paths for a 4×4×4 MIMO adaptive acoustic attenuation system using a shared state architecture in accordance with the invention. Note that adaptation of the nodal output adaptive weight vectors $w_{j,k}[k]$ and the nodal state adaptive weight matrices $K_{j,k}[k]$ are carried out using gradient descent techniques, and therefore the error signals are filtered through the appropriate acoustic 74 and electrical 72 paths to account for delays and/or phase changes, thus ensuring convergence.

The nodal output adaptive weight vectors $w_{j,k}[k]$ depend directly on the back propagation of the error signals $e_1[k]$, $e_2[k]$, $e_3[k]$, $e_4[k]$ through the associated acoustic paths $C_{j,k}[k]$, and the back-propagated filtered error vectors $\delta^s_{j,k}[k]$ depend indirectly on the filtered error signals $e_1[k]$, $e_2[k]$, $e_3[k]$, and $e_4[k]$, in accordance with back propagation of the error signals through the electrical paths H[k] 72. For instance, back-propagated filtered error vector $\delta^s_{1,2}[k]$ depends directly on filtered error value $\delta^y_2[k]$ but also indirectly on filtered error values $\delta^y_3[k]$ and $\delta^y_4[k]$ via back propagation. Filtered error value $\delta^y_4[k]$ is back-propagated through nodal output adaptive weight vector $w_{3,4}[k]$ to result in filtered error vector $\delta^s_{3,4}[k]$. Filtered error vector $\delta^s_{3,4}[k]$ is back-propagated through nodal state adaptive weight matrix $K_{2,4}[k]$ to form a component of filtered error vector $\delta^s_{2,3}[k]$. Filtered error value $\delta^y_3[k]$ is back-propagated through nodal output adaptive weight vector $w_{2,3}[k]$ to generate the other component of the filtered error vector $\delta^s_{2,3}[k]$. The filtered error vector $\delta^s_{2,3}[k]$ is back-propagated through nodal state adaptive weight matrix $K_{1,3}[k]$ to generate the indirect component for the filtered error vector $\delta^s_{1,2}[k]$.

For a three node system, electrical paths H[k] are defined as $$H[k]=\begin{bmatrix} w^T_{1,1} & w^T_{2,1}K_{2,1} & w^T_{2,1}K_{3,1}K_{3,2} \\ w^T_{1,2}K_{1,2} & w^T_{2,2} & w^T_{3,2}K_{3,2} \\ w^T_{2,3}K_{1,3}K_{1,2} & w^T_{2,3}K_{2,3} & w^T_{3,3} \end{bmatrix} \quad \text{(Eq. 17)}$$

The H[k] model adaptively models the acoustic plant. The above expression of H[k] shows that off-diagonal adaptive output weight vectors $w_{j,k}[k]$ and off-diagonal adaptive state weight matrices $K_{j,k}[k]$ need not be unique to obtain a unique H[k]. While the various weight vectors $w_{j,k}[k]$ and weight matrices $K_{j,k}[k]$ are dependent on one another, there is not necessarily a single unique solution to optimize H[k]. This means that the system may converge quicker to an optimum H[k] than a conventional centralized MIMO adaptive algorithm.

To improve system convergence at start-up, the initial values within the nodal state adaptive weight matrices $K_{j,k}$ should not be too small, otherwise information will not initially be passed through system to adjacent nodes. Nor should the initial values be too large, otherwise information from remote nodes is given too much weight.

It should be appreciated that the adaptive acoustic attenuation system 28 described in FIGS. 2–7 having a linear topology is flexible in that additional input sensors and/or acoustic actuators associated with digital signal processing nodes 30 can be added or eliminated from the system without requiring the system to be reconfigured and without requiring the rewriting of software. Furthermore, if a node is down or there is a fault in communication between digital signal processing nodes 30, the system 28 will effectively separate into two separate adaptive acoustic attenuation systems, both attempting to obtain global minimization of acoustic disturbances within the acoustic plant.

FIG. 2 shows each adaptive filter node 30A, 30B, 30C, . . . 30D, 30J as having a single associated input microphone 48A, and a single associated output actuator 44A, 44B, 44C, 44D, 44J. However, the invention does not require that each adaptive filter node 30A, 30B, 30C, 30D, 30J receive a separate reference signal $x_i[k]$ and output a separate correction signal $y_i[k]$. For instance, a node 30 does not necessarily need to receive a reference signal $x_i[k]$. In this case, the correction signal $y_i[k]$ could depend solely on nodal state vectors $s_{j,k}[k]$ shared from adjacent nodes unless a recursive nodal reference signal $u_i[k]$ is used. Likewise, unless a recursive nodal reference signal $u_i[k]$ is used, it should not be necessary for the node to have nodal state adaptive weight matrices $K_{j,k}[k]$ for adjusting shared nodal state signals $s_{j,k}[k]$ before sharing the adjusted signals with the adjacent adaptive filter nodes.

It is preferred that each node 30 be configured to generate at least one correction signal $y_i[k]$, however, if no correction signal $y_i[k]$ is generated and the node receives a reference signal $x_i[k]$, the node will merely pass adjusted nodal state signal vectors $s_{j,k}[k]$ to the adjacent nodes 30. On the other hand, providing multiple correction signals $y_i[k]$ from a single adaptive filter node 30 is contemplated within the scope of the invention as illustrated by FIG. 8. FIG. 8 shows an adaptive filter node 30M receiving multiple reference signals $x_{i,1}[k]$, $x_{i,2}[k]$ and outputting multiple correction signals $y_{i,1}[k]$, $y_{i,2}[k]$. The adaptive filter node 30M receives error signals $e_1[k]$ . . . $e_p[k]$ via common bus 48, and transmits shared state information $s_{j,k}[k]$, $\delta^s_{j,k}[k]$ to adjacent nodes. It should be noted that if all of the reference signals $x_{i,j}[k]$ and correction signals $y_{i,j}[k]$ are associated with a single node, the system collapses into a conventional centralized MIMO adaptive acoustic attenuation system which globally optimizes the error signals $e_1[k]$ . . . $e_p[k]$.

Although FIGS. 2–8 illustrate the system 28 in its preferred embodiment which is a linear network topology. FIG. 9 illustrates a system 200 having a plurality of adaptive filter nodes 202 arranged in a rectangular topology. As shown in FIG. 9, each adaptive filter node 202 can receive a reference signal $x_i[k]$ and generate a correction signal $y_i[k]$. Nodal state and error back-propagation information are shared with adjacent nodes 202. Error signals $e_1[k]$, $e_2[k]$, $e_3[k]$ . . . $e_p[k]$ are transmitted globally to adapt nodal output adaptive weight vectors $w_{j,k}[k]$ and nodal state adaptive weight matrices $K_{j,k}[k]$. Likewise, FIG. 10 illustrates a system 300 including a plurality of adaptive filter nodes 302 arranged in a random web topology. Each adaptive filter node 302 preferably receives a reference signal $x_i[k]$ and outputs a correction signal $y_i[k]$, and shares nodal state vectors and back-propagation information with adjacent nodes. Error signals are globally transmitted to all of the nodes 302.

While the preferred embodiment of the invention involves a purely active acoustic attenuation system, a combined active/passive attenuation system is contemplated within the scope of the invention. Other alternatives, modifications and equivalents may be apparent to those skilled in the art. Such alternatives, modifications and equivalents should be considered to fall within the scope of the following claims.

We claim:

1. An adaptive acoustic attenuation system comprising:

at least one acoustic actuator;

a plurality of adaptive filter nodes each including a nodal digital signal processor;

one or more error sensors that sense acoustic disturbances in an acoustic plant and generate an error signal in response thereto, the one or more error signals being transmitted globally to the plurality of adaptive filter nodes;

wherein each adaptive filter node outputs at least one nodal state signal that is transmitted directly to at least one other adaptive filter node, the nodal state signals being generated in accordance with nodal state adaptive parameters that are updated in accordance with at least one of the globally transmitted error signals; and wherein at least one of the adaptive filter nodes is associated with each acoustic actuator and outputs a correction signal that drives the acoustic actuator, the correction signal being generated in accordance with nodal output adaptive parameters that are updated in accordance with at least one of the globally transmitted error signals; and further wherein there are a plurality of J-adaptive filter nodes each associated with an acoustic actuator and each outputting a correction signal $y_i[k]$ that drives the associated acoustic actuator, and wherein each correction signal $y_i[k]$ is a scalar value generated in accordance with the following expression:

$$y_i[k]=w_{i,i}^T[k]u_i[k]+w_{i-1,i}^T[k]s_{i-1,i}[k]+w_{i+1,i}^T[k]s_{i+1,i}[k]$$

where the state signals $s_{i,i+1}[k]$ and $s_{i,i-1}[k]$ are generated in accordance with the following expressions:

$$s_{i,i+1}[k]=K_{i,i+1}[k]u_i[k]+K_{i-1,i+1}[k]s_{i-1,i}[k]$$

$$s_{i,i-1}[k]=K_{i,i-1}[k]u_i[k]+K_{i+1,i-1}[k]s_{i+1,i}[k]$$

where $u_i[k]$ is a generalized recursive nodal reference signal vector given by $[x_i[k] \ldots x_i[k-M+1]y_i[k-1] \ldots y_i[k-M]]^T$, M is one-half of the tap length of the recursive nodal reference signal vector $u_i[k]$, $s_{j,1}[k]$ is the nodal state signal vector transmitted from the $j^{th}$ adaptive filter node to the $1^{th}$ adaptive filter node, $K_{j,1}[k]$ is a nodal state adaptive parameter matrix for transforming nodal input from the $j^{th}$ node into a nodal state vector that is transmitted to the $1^{th}$ node, $w_{j,i}^T[k]$ is the nodal output adaptive parameter vector which transforms input from the $j^{th}$ node into information used to generate the correction signal $y_i[k]$ for the $i^{th}$ node.

2. The adaptive acoustic attenuation system recited in claim 1 wherein the nodal output adaptive parameter vectors $w_{i,i}[k]$ are adapted in accordance with the following expressions:

$$w_{i,i}[k+1]=w_{i,i}[k]-\eta\delta_i^y[k-N]u_i[k-N]$$

$$w_{i\pm1,i}[k+1]=w_{i\pm1,i}[k]-\eta\delta_i^y[k-N]s_{i\pm1,i}[k-N]$$

$$\delta_i^y[k]=-\sum_{l=1}^{J}[e_l[k],\ e_l[k+1],\ \ldots,\ e_l[k+N]]^T c_{i,l}[k]$$

where $\delta^y_i[k]$ represents the error signals $e_1[k]$, $e_1[k+1]$, . . . $e_1[k+N]$ being back-filtered through the auxiliary path $c_{i,l}[k]$ associated with the $1^{th}$ error sensor to the actuator receiving the correction signal $y_i[k]$ from the $i^{th}$ node; N is the tap length of the auxiliary paths $c_{i,l}[k]$ and $\eta$ is a step size.

3. The adaptive acoustic attenuation system recited in claim 2 wherein the nodal state adaptive parameter matrices $K_{j,i}[k]$ are updated in accordance with the following expressions:

$$K_{i,i+1}[k+1]=K_{i,i+1}[k]-\eta\delta_{i,i+1}^s[k]u_i^T[k-N] \text{ for } 1\leqq i\leqq J$$

$$K_{i,i-1}[k+1]=K_{i,i-1}[k]-\eta\delta_{i,i-1}^s[k]u_i^T[k-N] \text{ for } 2\leqq i\leqq J$$

$$K_{i-1,i+1}[k+1]=K_{i-1,i+1}[k]-\eta\delta_{i,i+1}^s[k]s_{i-1,i}^T[k-N]$$

$$K_{i+1,i-1}[k+1]=K_{i+1,i-1}[k]-\eta\delta_{i,i-1}^s[k]s_{i+1,i}^T[k-N]$$

where $\delta_{i,j}^s[k]$ is a vector representing filtered error back propagation.

4. An adaptive acoustic attenuation system as recited in claim 1 wherein the one or more error signals transmitted globally to the adaptive filter nodes are analog signals.

5. An adaptive acoustic attenuation system as recited in claim 1 wherein the nodal state signals transmitted directly between adaptive filter nodes are digital signals.

6. An adaptive acoustic attenuation system as recited in claim 1 wherein the nodal state signals output by the adaptive filter nodes are each a member of a nodal state signal vector.

7. An adaptive acoustic attenuation system as recited in claim 1 wherein the nodal state signals are generated further in accordance with other nodal state signals transmitted directly to the respective adaptive filter node.

8. An adaptive acoustic attenuation system as recited in claim 7 wherein the nodal state signals are generated further in accordance with a nodal reference signal.

9. An adaptive acoustic attenuation system as recited in claim 8 wherein the nodal reference signal is a generalized recursive nodal reference signal including an input signal component and a correction signal component.

10. An adaptive acoustic attenuation system as recited in claim 1 wherein each adaptive filter node is associated with an acoustic actuator; and the adaptive filter node outputs a correction signal that drives the associated acoustic actuator.

11. An adaptive acoustic attenuation system as recited in claim 10 wherein the nodal digital signal processor for the respective adaptive filter node outputs a digital correction signal to a nodal D/A converter which outputs an analog correction signal to the acoustic actuator.

12. An adaptive acoustic attenuation system as recited in claim 10 wherein the nodal correction signal is generated in accordance with the nodal output adaptive parameters, a nodal reference signal and at least one state signal directly transmitted to the adaptive filter node from one of the other adaptive filter nodes.

13. An adaptive acoustic attenuation system as recited in claim 1 wherein each adaptive filter node associated with an acoustic actuator is also associated with an input sensor.

14. An adaptive acoustic attenuation system as recited in claim 13 wherein the nodal digital signal processor outputs a digital correction signal to a nodal D/A converter which outputs an analog correction signal to the acoustic actuator, and the input sensor outputs an analog reference signal to an A/D converter which outputs a digital reference signal to the nodal digital signal processor.

15. An adaptive acoustic attenuation system as recited in claim 1 wherein the acoustic actuator is an active acoustic attenuation actuator.

16. The active adaptive acoustic attenuation system as recited in claim 15 wherein the system is a sound attenuation system and the acoustic actuator is a loudspeaker.

17. The active adaptive acoustic attenuation system as recited in claim 15 wherein the system is a vibration attenuation system and the active acoustic actuator is an electromagnetic shaker.

18. The adaptive acoustic attenuation system as recited in claim 1 wherein the acoustic actuator changes a physical characteristic of an adjustable passive acoustic attenuator.

19. An adaptive acoustic attenuation system as recited in claim 1 wherein each adaptive filter node associated with an acoustic actuator contains the C model filters corresponding to the auxiliary paths from the adaptive filter node through the associated acoustic actuator to the error sensors.

20. An adaptive acoustic attenuation system as recited in claim 19 wherein the C model filters are adapted on-line using a random noise source.

21. An adaptive acoustic attenuation system as recited in claim 19 wherein the correction signal generated by each adaptive filter node is generated in accordance with nodal output adaptive parameters that are updated based on filtered error signals which are filtered through a back-propagation of the appropriate electronic and acoustic paths from the corresponding error sensor to the respective adaptive filter node.

22. The adaptive acoustic attenuation system as recited in claim 21 wherein the nodal state signal vectors are generated further in accordance with nodal state signal vectors transmitted to the respective adaptive filter node directly from another adaptive filter node.

23. The active acoustic attenuation system as recited in claim 22 wherein the nodal state vector signals are generated further in accordance with a reference signal inputting the adaptive filter node from an associated input sensor.

24. A multiple input multiple output active acoustic attenuation system for actively attenuating acoustic disturbances in an acoustic plant, the system comprising:

a plurality of J active acoustic actuators, each associated with an adaptive filter node such that the associated adaptive filter node provides a correction signal to the respective active acoustic actuator and the actuator outputs a secondary acoustic input into the acoustic plant in response to the correction signal;

a plurality of P error sensors that sense acoustic disturbances in the acoustic plant and generate error signals in response thereto;

wherein each adaptive filter node includes a nodal digital signal processor that communicates with at least one other nodal digital signal processor contained within another adaptive filter node to provide distributed processing for a multiple input multiple output adaptive filter control model via a shared state nodal architecture; and the system further comprises:

a plurality of J-adaptive filter nodes each associated with an acoustic actuator and each outputting a correction signal $y_i[k]$ that drives the associated acoustic actuator, and wherein each correction signal $y_i[k]$ is a scalar value generated in accordance with the following expressions:

$$y_i[k]=w_{i,i}^T[k]u_i[k]+w_{i-1,i}^T[k]s_{i-1,i}[k]+w_{i+1,i}^T[k]s_{i+1,i}[k]$$

$$s_{i,i+1}[k]=K_{i,i+1}[k]u_i[k]+K_{i-1,i+1}[k]s_{i-1,i}[k]$$

$$s_{i,i-1}[k]=K_{i,i-1}[k]u_i[k]+K_{i+1,i-1}[k]s_{i+1,i}[k]$$

where $u_i[k]$ is a generalized recursive nodal reference signal vector given by $[x_i[k] \ldots x_i[k-M+1]\ y_i[k-1] \ldots y_i[k-M]]^T$, M is one-half of the tap length of the recursive nodal reference signal vector $u_i[k]$, $s_{j,l}[k]$ is the nodal state signal vector transmitted from the $j^{th}$ adaptive filter node to the $l^{th}$ adaptive filter node, $K_{j,l}[k]$ is a nodal state adaptive parameter matrix for transforming nodal input from the $j^{th}$ node into a nodal state vector that is transmitted to the $l^{th}$ node, $w_{j,i}^T$ is the nodal output adaptive parameter vector which transforms input from the $j^{th}$ node into information used to generate the correction signal $y_i[k]$ for the $i^{th}$ node.

25. The active acoustic attenuation system recited in claim 24 wherein the plurality of P error signals are globally transmitted to all of the adaptive filter nodes.

26. An active acoustic attenuation system as recited in claim 24 wherein at least one of the adaptive filter nodes is associated with at least two active acoustic actuators and the nodal digital signal processor for the respective adaptive filter node provides a separate correction signal for each of the active acoustic actuators associated with the adaptive filter node.

27. An active acoustic attenuation system as recited in claim 24 further comprising at least one input sensor having an associated adaptive filter node.

28. An active acoustic attenuation system as recited in claim 24 wherein each adaptive filter node outputs at least one nodal state signal vector that is transmitted directly to at least one other adaptive filter node, said nodal state signal vector being generated in accordance with nodal state adaptive parameters that are updated in accordance with the error signals.

29. An active acoustic attenuation system as recited in claim 24 wherein at least one of the adaptive filter nodes associated with an active acoustic actuator also receives a reference signal from an input sensor.

30. An active acoustic attenuation system as recited in claim 24 wherein local communication of nodal state vector signals between adaptive filter nodes is defined by a linear topology.

31. An active acoustic attenuation system as recited in claim 24 wherein local communication of nodal vector signals between adaptive filter nodes is defined by a rectangular topology.

32. An active acoustic attenuation system as recited in claim 24 wherein local communication of nodal state vector signals between adaptive filter nodes occurs over a communication web in which each respective adaptive filter node does not in general receive nodal state vector signals from the same number of nodes as the respective adaptive filter node outputs to other adaptive filter nodes.

33. An active acoustic attenuation system recited in claim 24 wherein the nodal output adaptive parameter vectors $w_{i,i}[k]$, are adapted in accordance with the following expressions:

$$w_{i,i}[k+1]=w_{i,i}[k]-\eta\delta_i^y[k-N]u_i[k-N]$$

$$w_{i\pm1,i}[k+1]=w_{i\pm1,i}[k]-\eta\delta_i^y[k-N]s_{i\pm1,i}[k-N]$$

$$\delta_i^y[k] = -\sum_{l=1}^{J} [e_l[k], e_l[k+1], \ldots, e_l[k+N]]^T c_{i,l}[k]$$

where $\delta^y{}_i[k]$ represents the error signals $e_1[k]$, $e_1[k+1]$, . . . $e_1[k+N]$ being back-filtered through the auxiliary path $c_{i,l}[k]$ associated with the $1^{th}$ error sensor to the actuator receiving the correction signal $y_i[k]$ from the $i^{th}$ node; N is the tap length of the auxiliary paths $c_{i,l}[k]$ and $\eta$ is a step size.

34. An active acoustic attenuation system recited in claim 33 wherein the nodal state adaptive parameter matrices $K_{j,i}[k]$ are updated in accordance with the following expressions:

$$K_{i,i+1}[k+1]=K_{i,i+1}[k]-\eta\delta_{i,i+1}{}^s[k]u_i{}^T[k-N] \text{ for } 1\leqq i\leqq J-1$$

$$K_{i,i+1}[k+1]=K_{i,i+1}[k]-\eta\delta_{i,i-1}{}^s[k]u_i{}^T[k-N] \text{ for } 2\leqq i\leqq J$$

$$K_{i-1,i+1}[k+1]=K_{i-1,i+1}[k]-\eta\delta_{i,i+1}{}^s[k]s_{i-1,i}{}^T[k-N]$$

$$K_{i+1,i-1}[k+1]=K_{i+1,i-1}[k]-\eta\delta_{i,i-1}{}^s[k]s_{i+1,i}{}^T[k-N]$$

where $\delta_{i,j}{}^s[k]$ is a vector representing filtered error back-propagation.

35. The active acoustic attenuation system recited in claim 24 wherein the correction signal generated by each adaptive filter node is generated in accordance with nodal output adaptive parameters that are updated based on filtered error signals which are filtered through a back-propagation of the appropriate electronic and acoustic paths from the corresponding error sensor to the respective adaptive filter node.

36. The active acoustic attenuation system recited in claim 24 wherein the correction signal generated by each adaptive filter node is generated in accordance with the nodal output adaptive parameters, a nodal reference signal, and at least one, state signal directly transmitted to the adaptive filter node from one of the other adaptive filter nodes.

37. An active acoustic attenuation system as recited in claim 24 wherein the nodal digital signal processor outputs a digital correction signal to a nodal D/A converter which outputs an analog correction signal to the active acoustic actuator.

38. The active acoustic attenuation system as recited in claim 37 further comprising an input sensor associated with at least one of the adaptive filter nodes and an A/D converter which is contained within the respective adaptive filter nodes, the input sensor outputting an analog reference signal to the A/D converter which outputs a digital reference signal to the nodal digital signal processor.

39. The active acoustic attenuation system as recited in claim 24 wherein the system is a sound vibration system and the acoustic actuator is a loudspeaker.

40. The active acoustic attenuation system as recited in claim 24 wherein the system is a vibration attenuation system and the active acoustic actuator is an electromagnetic shaker.

41. The active acoustic attenuation system recited in claim 24 wherein each adaptive filter node associated with an acoustic actuator contains C model filters corresponding to the auxiliary paths from the respective adaptive filter node through the associated actuator to the error sensors.

42. An active acoustic attenuation system as recited in claim 41 wherein the C model filters are adapted on-line using a random noise source.

43. In a multiple input multiple output active acoustic attenuation system having a plurality of digital signal processing nodes, a method of distributing processing and adaptation to attain global minimization of acoustic disturbances in an acoustic plant, the method comprising the steps of:

sensing acoustic disturbances throughout the acoustic plant with a plurality of error sensors and generating a plurality of error signals in response thereto;

using a plurality of acoustic actuators to inject secondary acoustic input into the acoustic plant;

providing a plurality of digital signal processing nodes and generating a nodal state signal vector within the node by filtering a nodal state signal vector generated by another digital signal processing node with a nodal state adaptive parameter matrix;

generating a correction signal in a plurality of the digital signal processing nodes by filtering a nodal state signal vector generated within another digital signal processing node with a nodal output adaptive parameter vector, each correction signal driving one of the acoustic actuators;

filtering the error signals through the back propagation of the appropriate electrical and acoustic paths corresponding to the associated intervening digital signal processing nodes, acoustic actuator and the respective error sensors;

adapting the nodal output adaptive parameter vector via gradient descent adaptation based on filtered error signals; and adapting the nodal state adaptive parameter matrix via gradient descent adaptation based on filtered error signal vectors;

wherein the correction signal $y_i[k]$ for the $i^{th}$ digital signal processing node is generated in accordance with the following expressions:

$$y_i[k]=w_{i,i}{}^T[k]u_i[k]+w_{i-1,i}{}^T[k]s_{i-1,i}[k]+w_{i+1,i}{}^T[k]s_{i+1,i}[k]$$

$$s_{i,i+1}[k]=K_{i,i+1}[k]u_i[k]+K_{i-1,i+1}[k]s_{i-1,i}[k]$$

$$s_{i,i-1}[k]=K_{i,i-1}[k]u_i[k]+K_{i+1,i-1}[k]s_{i+1,i}[k]$$

where $u_i[k]$ is a generalized recursive nodal reference signal vector given by $[x_i[k] \ldots x_i[k-M+1]y_i[k-1] \ldots y_i[k-M]]^T$, M is one-half of the tap length of the recursive nodal reference signal vector $u_i[k]$, $s_{j,l}[k]$ is the nodal state signal vector transmitted from the $j^{th}$ adaptive filter node to the $1^{th}$ adaptive filter node, $K_{j,l}[k]$ is a nodal state adaptive parameter matrix for transforming nodal input from the $j^{th}$ node into a nodal state vector that is transmitted to the $1^{th}$ node, $w_{j,i}[k]$ is the nodal output adaptive parameter vector which transforms input from the $j^{th}$ node into information used to generate the correction signal $y_i[k]$ for the $i^{th}$ node.

44. The method as recited in claim 43 further comprising the step of providing a reference signal to at least one of the digital signal processing nodes and in that digital signal processing node generating the nodal state signal vector by filtering a nodal state signal vector generated by another digital signal processing node with a nodal state adaptive parameter matrix and adding the resultant to the resultant of filtering the reference signal vector with another nodal state adaptive parameter matrix; and wherein the correction signal generated by that digital signal processing node is generated by filtering the nodal state signal vector generated by another node with a nodal output adaptive parameter vector and adding the resultant with the resultant of filtering a reference signal vector with another nodal output adaptive parameter vector.

45. A method as recited in claim 43 wherein adaptation of the nodal output adaptive parameter vectors is generated in accordance with the following expressions:

$$w_{i,i}[k+1]=w_{i,i}[k]-\eta\delta_i^y[k-N]u_i[k-N]$$

$$w_{i\pm1,i}[k+1]=w_{i\pm1,i}[k]-\eta\delta_i^y[k-N]s_{i\pm1,i}[k-N]$$

$$\delta_i^y[k]=-\sum_{l=1}^{J}[e_l[k],e_l[k+1],\ldots,e_l[k+N]]^T c_{i,l}[k]$$

where $\delta_i^y[k]$ represents the error signals $e_1[k]$, $e_1[k+1]$, . . . $e_1[k+N]$ being back-filtered through the auxiliary path $c_{i,l}[k]$ associated with the $l^{th}$ error sensor to the actuator receiving the correction signal $y_i[k]$ from the $i^{th}$ node; N is the tap length of the auxiliary paths $c_{i,l}[k]$ and $\eta$ is a step size.

46. A method as recited in claim 45 wherein the nodal state adaptive parameter matrices are generated in accordance with the following expressions:

$$K_{i,i+1}[k+1]=K_{i,i+1}[k]-\eta\delta_{i,i+1}^s[k]u_i^T[k-N] \text{ for } 1\leq i\leq J-1$$

$$K_{i,i-1}[k+1]=K_{i,i-1}[k]-\eta\delta_{i,i-1}^s[k]u_i^T[k-N] \text{ for } 2\leq i\leq J$$

$$K_{i-1,i+1}[k+1]=K_{i-1,i+1}[k]-\eta\delta_{i,i+1}^s[k]s_{i-1,i}^T[k-N]$$

$$K_{i+1,i-1}[k+1]=K_{i+1,i-1}[k]-\eta\delta_{i,i-1}^s[k]s_{i+1,i}^T[k-N]$$

where $\delta_{i,j}^s[k]$ is a vector representing filtered error back-propagation.

* * * * *